United States Patent
Sakuishi

(10) Patent No.: US 9,466,811 B2
(45) Date of Patent: Oct. 11, 2016

(54) LIGHT-EMITTING DEVICE, MODULE, ELECTRONIC DEVICE, AND MANUFACTURING METHOD OF LIGHT-EMITTING DEVICE

(71) Applicant: Semiconductor Energy Laboratory Co., Ltd., Kanagawa-ken (JP)

(72) Inventor: Tatsuya Sakuishi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/750,295

(22) Filed: Jun. 25, 2015

(65) Prior Publication Data

US 2015/0380680 A1    Dec. 31, 2015

(30) Foreign Application Priority Data

Jun. 27, 2014 (JP) .................. 2014-132741

(51) Int. Cl.
| | | |
|---|---|---|
| H01L 51/00 | (2006.01) | |
| H01L 51/52 | (2006.01) | |
| H01L 51/56 | (2006.01) | |
| H01L 27/32 | (2006.01) | |
| H01L 51/50 | (2006.01) | |

(52) U.S. Cl.
CPC ....... *H01L 51/5253* (2013.01); *H01L 27/3241* (2013.01); *H01L 27/3244* (2013.01); *H01L 27/3246* (2013.01); *H01L 27/3248* (2013.01); *H01L 27/3258* (2013.01); *H01L 27/3276* (2013.01); *H01L 51/50* (2013.01); *H01L 51/5203* (2013.01); *H01L 51/5206* (2013.01); *H01L 51/5221* (2013.01); *H01L 51/5246* (2013.01); *H01L 51/56* (2013.01)

(58) Field of Classification Search
None
See application file for complete search history.

(56) References Cited

U.S. PATENT DOCUMENTS

| | | |
|---|---|---|
| 7,045,442 B2 | 5/2006 | Maruyama et al. |
| 7,091,070 B2 | 8/2006 | Imai et al. |
| 7,105,448 B2 | 9/2006 | Takayama et al. |
| 7,271,076 B2 | 9/2007 | Yamazaki et al. |
| 7,452,786 B2 | 11/2008 | Dozen et al. |
| 7,465,674 B2 | 12/2008 | Tamura et al. |
| 7,482,248 B2 | 1/2009 | Tamura |
| 7,566,633 B2 | 7/2009 | Koyama et al. |
| 7,605,056 B2 | 10/2009 | Takahashi et al. |
| 7,611,965 B2 | 11/2009 | Suzuki et al. |
| 7,632,740 B2 | 12/2009 | Aoki et al. |
| 7,723,209 B2 | 5/2010 | Maruyama et al. |
| 7,727,773 B2 | 6/2010 | Toriumi |
| 7,736,958 B2 | 6/2010 | Dozen et al. |
| 7,745,252 B2 | 6/2010 | Suzuki et al. |
| 7,883,939 B2 | 2/2011 | Chida |
| 7,968,382 B2 | 6/2011 | Jinbo et al. |
| 7,972,910 B2 | 7/2011 | Dairiki et al. |

(Continued)

FOREIGN PATENT DOCUMENTS

JP    2012-190794 A    10/2012

*Primary Examiner* — Minh-Loan Tran
(74) *Attorney, Agent, or Firm* — Husch Blackwell LLP

(57) ABSTRACT

A novel light-emitting device that is highly convenient or reliable is provided. A method for manufacturing a novel light-emitting device that is highly convenient or reliable is also provided. Further, a novel light-emitting device, a method for manufacturing a novel light-emitting device, or a novel device is provided. The present inventor has conceived the structure in which a first insulating film and a light-emitting element are provided between a first support having certain isotropy and a second support.

12 Claims, 13 Drawing Sheets

(56) References Cited

U.S. PATENT DOCUMENTS

| | | |
|---|---|---|
| 8,012,812 B2 | 9/2011 | Okazaki |
| 8,040,469 B2 | 10/2011 | Nakamura et al. |
| 8,372,668 B2 | 2/2013 | Hatano et al. |
| 8,409,973 B2 | 4/2013 | Chida et al. |
| 9,006,051 B2 | 4/2015 | Oikawa et al. |
| 9,324,449 B2 * | 4/2016 | Yamazaki ............ G11C 19/28 |
| 2003/0025118 A1 * | 2/2003 | Yamazaki ............ H01L 51/529 257/79 |
| 2003/0082889 A1 * | 5/2003 | Maruyama ......... H01L 27/1214 438/455 |
| 2012/0001293 A1 * | 1/2012 | Ben Mohamed . H01L 21/76254 257/506 |
| 2012/0217516 A1 | 8/2012 | Hatano et al. |
| 2014/0234664 A1 | 8/2014 | Yasumoto et al. |
| 2014/0332150 A1 | 11/2014 | Hirakata et al. |
| 2015/0044792 A1 | 2/2015 | Aoyama et al. |
| 2015/0059987 A1 | 3/2015 | Kumakura et al. |
| 2015/0075720 A1 | 3/2015 | Hirakata et al. |
| 2015/0123106 A1 | 5/2015 | Yasumoto et al. |

* cited by examiner

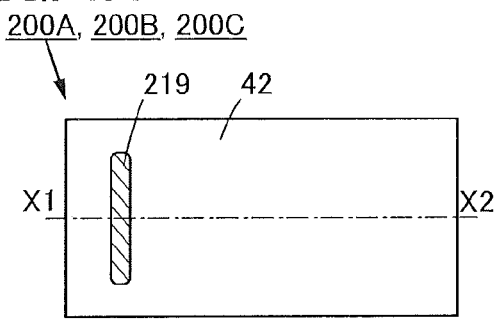
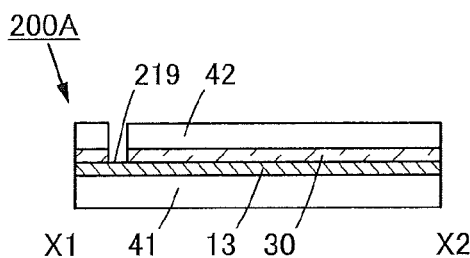
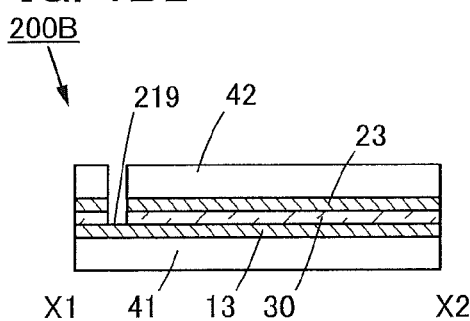
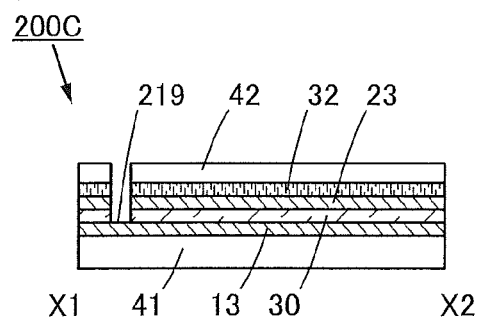
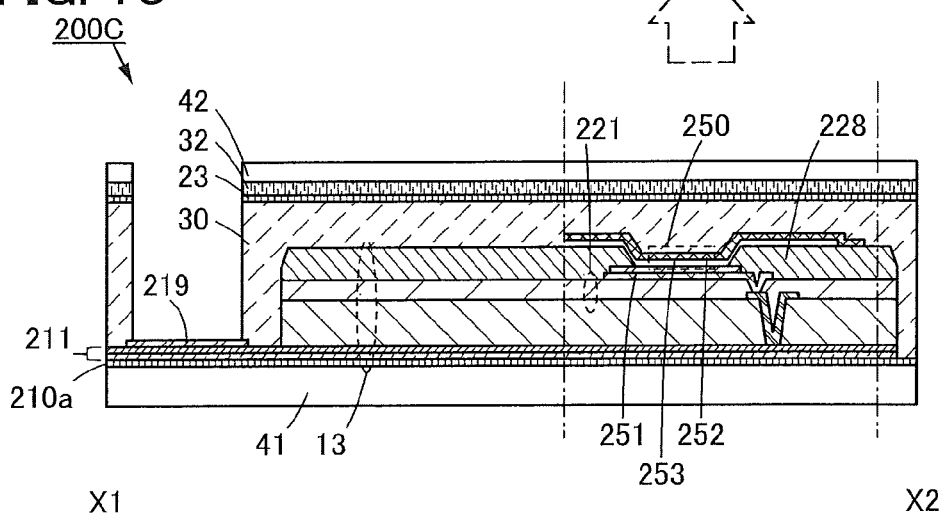

FIG. 2A1
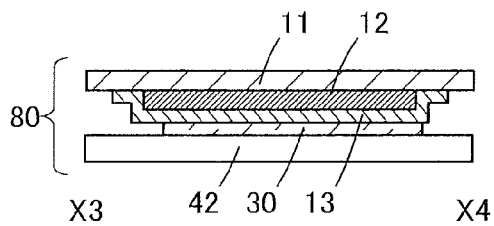
FIG. 2A2
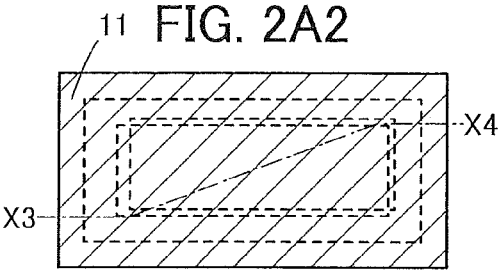
FIG. 2B1
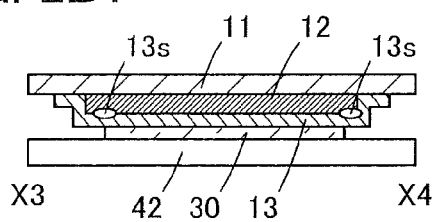
FIG. 2B2
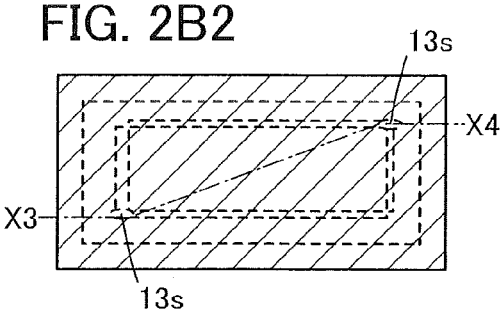
FIG. 2C
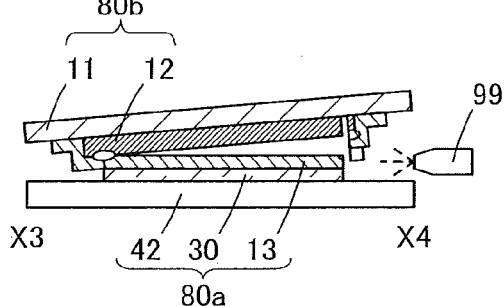
FIG. 2D1
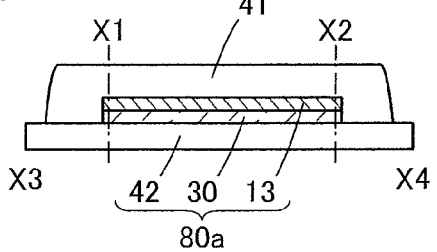
FIG. 2D2
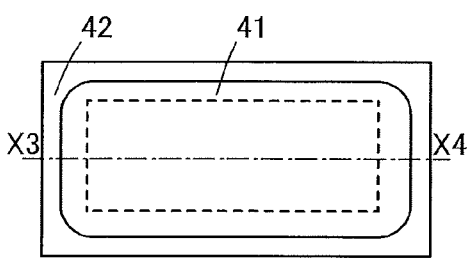
FIG. 2E1
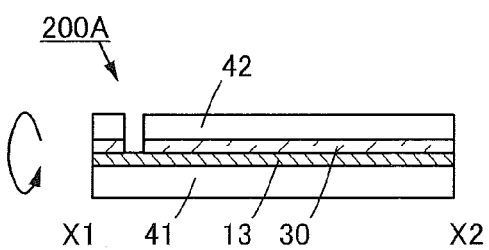
FIG. 2E2
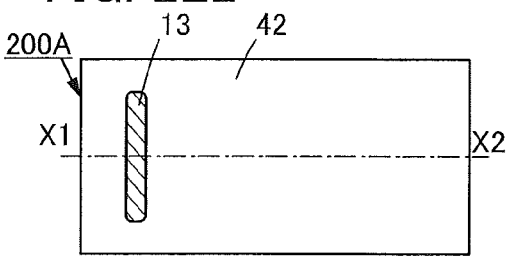

FIG. 3A1
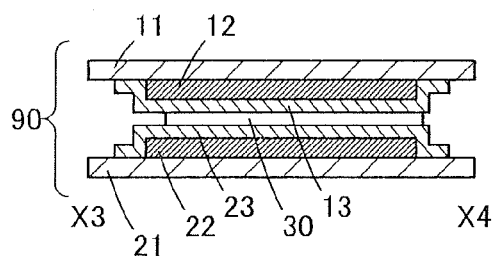
FIG. 3A2
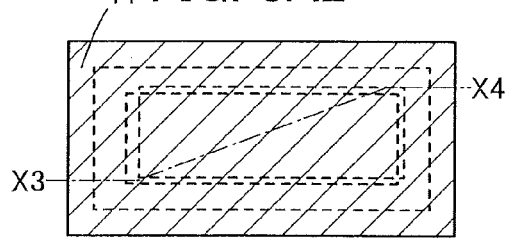
FIG. 3B1
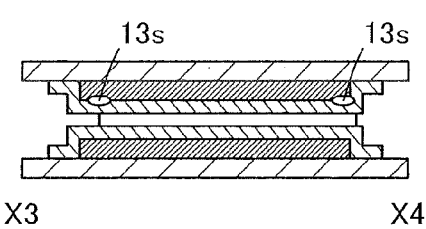
FIG. 3B2
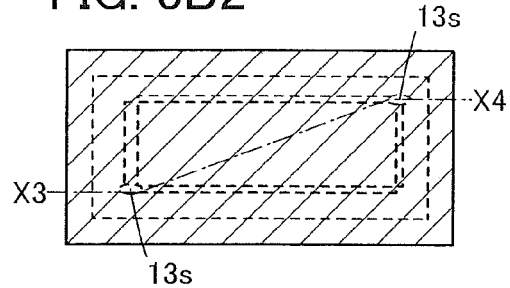
FIG. 3C
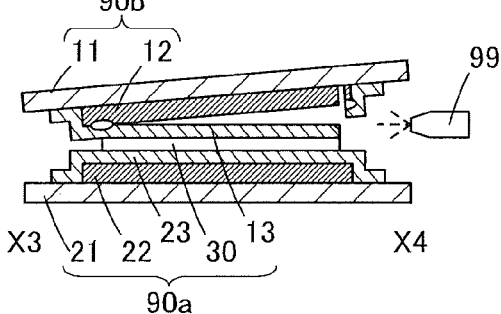
FIG. 3D1
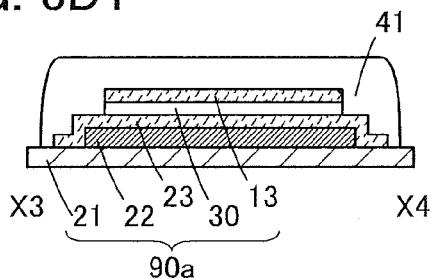
FIG. 3D2
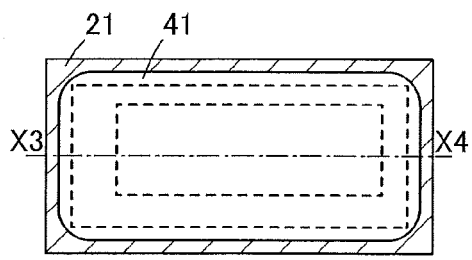
FIG. 3E1
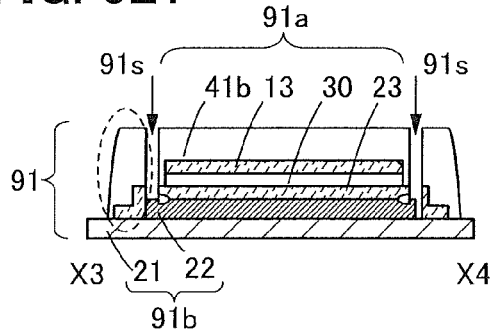
FIG. 3E2
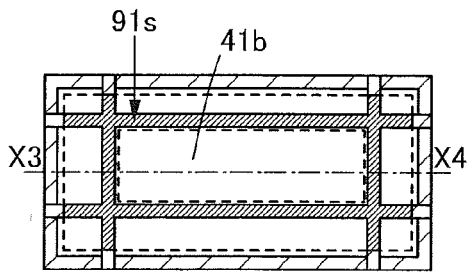

FIG. 4A
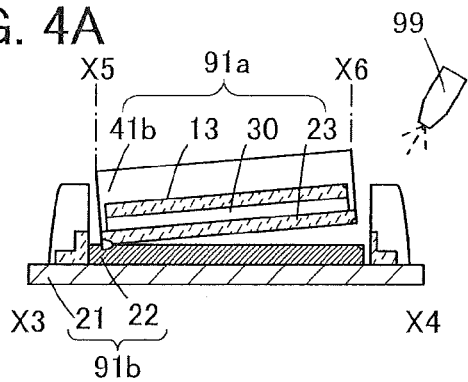
FIG. 4B
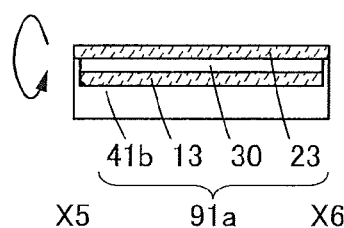
FIG. 4C1
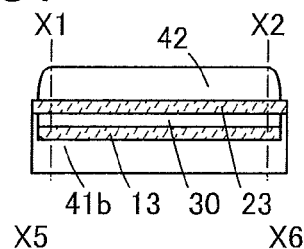
FIG. 4C2
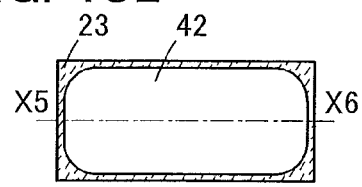
FIG. 4D1
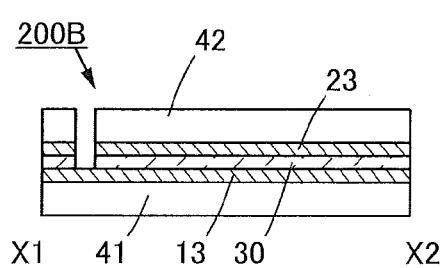
FIG. 4D2
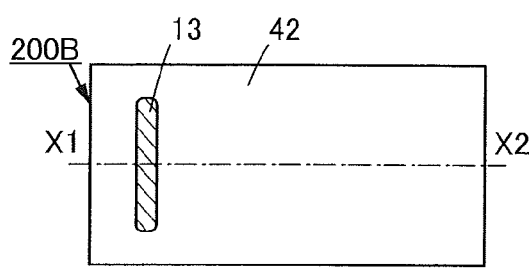

FIG. 5A1
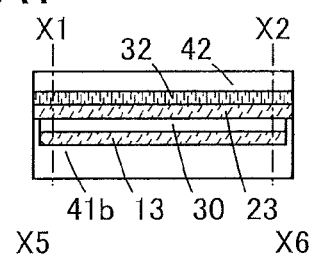
FIG. 5A2
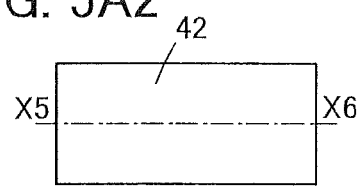
FIG. 5B1
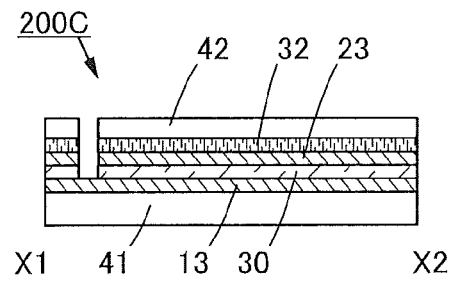
FIG. 5B2
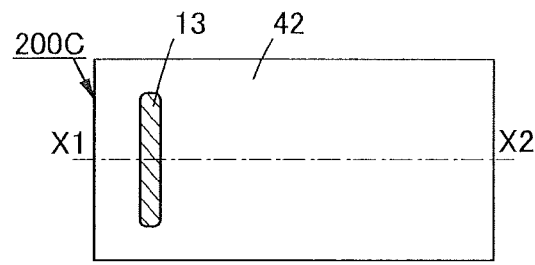

FIG. 9A1
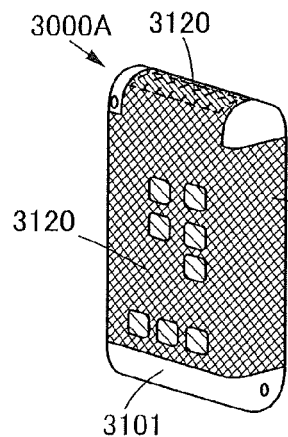
FIG. 9A2
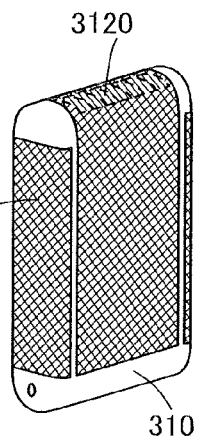
FIG. 9A3
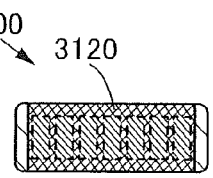
FIG. 9B1
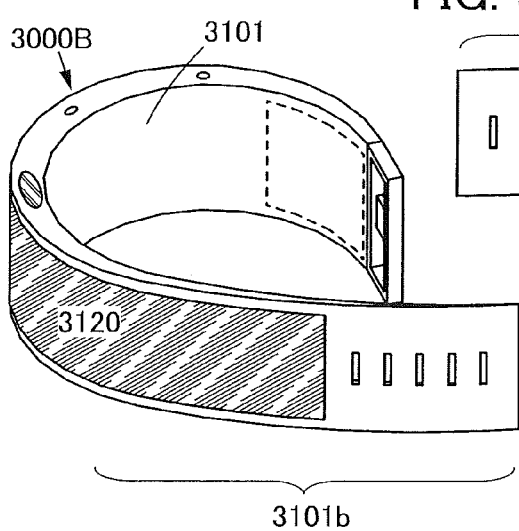
FIG. 9B2
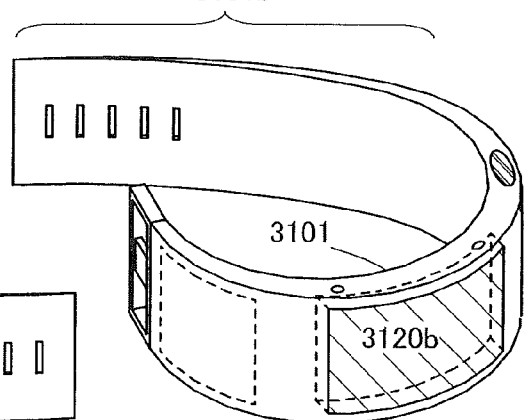
FIG. 9C1
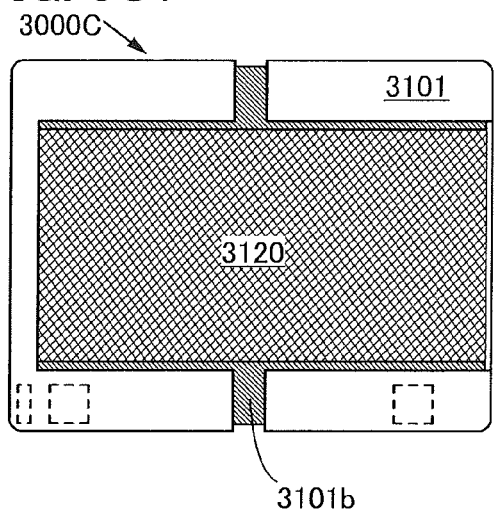
FIG. 9C2
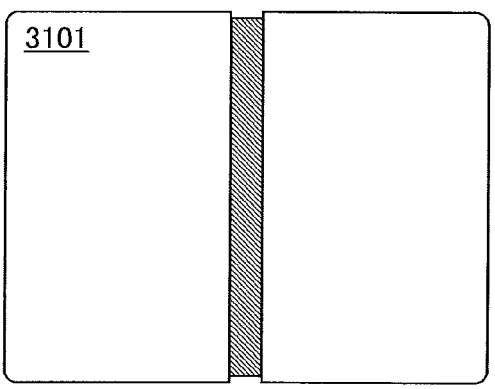

FIG. 10A
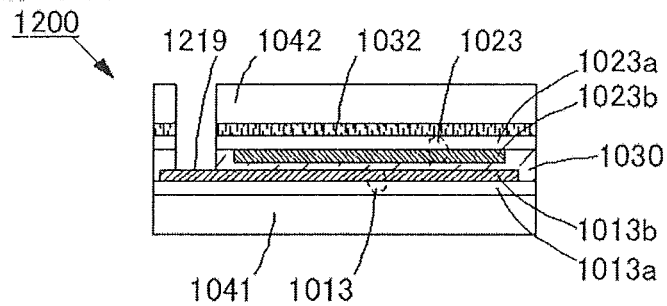
FIG. 10B1
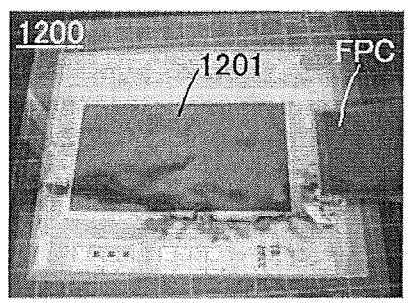
FIG. 10B2
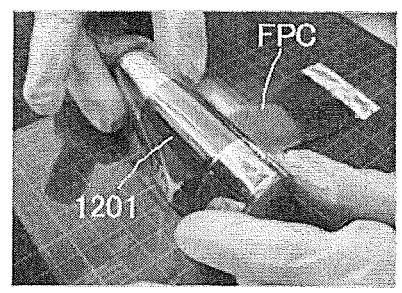
FIG. 10C1
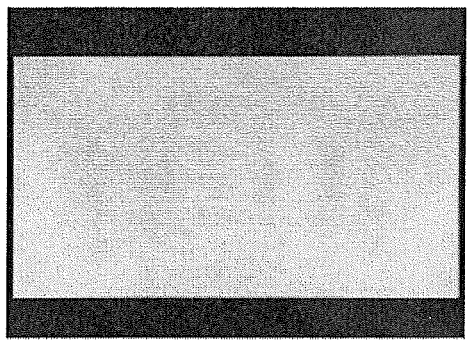
FIG. 10C2
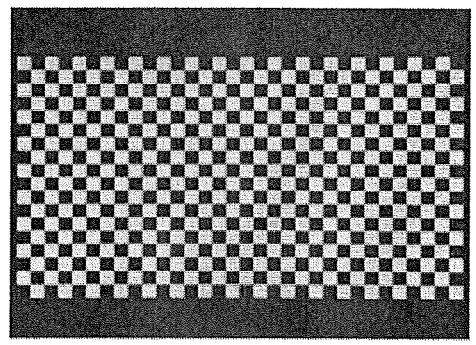
FIG. 10C3
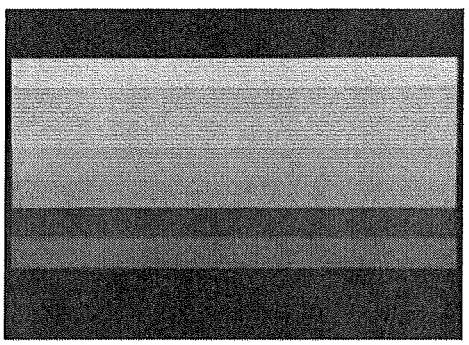

LIGHT-EMITTING DEVICE, MODULE, ELECTRONIC DEVICE, AND MANUFACTURING METHOD OF LIGHT-EMITTING DEVICE

BACKGROUND OF THE INVENTION

1. Field of the Invention

One embodiment of the present invention relates to a light-emitting device or a manufacturing method of the light-emitting device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an input/output device, a method for driving any of them, and a method for manufacturing any of them.

2. Description of the Related Art

Display devices with large screens can display many pieces of information. Therefore, such display devices are excellent in browsability and suitable for data-processing devices.

The social infrastructures for transmitting information have advanced. This has made it possible to acquire, process, and transmit a wide variety of information with the use of a data-processing device not only at home or office but also away from home or office. With this situation, portable data-processing devices are under active development.

Because portable data-processing devices are often used outdoors, force might be accidentally applied by dropping to the data-processing devices and display devices included in them. A known example of a display device that is not easily broken is a display device having high adhesiveness between a structure body by which a light-emitting layer is divided and a second electrode layer (Patent Document 1).

REFERENCE

Patent Document

[Patent Document 1] Japanese Published Patent Application No. 2012-190794

SUMMARY OF THE INVENTION

An object of one embodiment of the present invention is to provide a novel light-emitting device that is highly convenient or reliable. Another object of one embodiment of the present invention is to provide a method for manufacturing a novel light-emitting device that is highly convenient or reliable. Another object of one embodiment of the present invention is to provide a novel light-emitting device or a method for manufacturing a novel light-emitting device. Another object of one embodiment of the present invention is to provide a novel display device or a method for manufacturing a novel display device.

Note that the description of these objects does not disturb the existence of other objects. Note that in one embodiment of the present invention, there is no need to achieve all the objects. Other objects are apparent from and can be derived from the description of the specification, the drawings, the claims, and the like.

One embodiment of the present invention is a light-emitting device including a first support, a first layer to be separated overlapping with the first support, a bonding layer overlapping with the first layer to be separated, and a second support overlapping with the bonding layer.

The first support has isotropy. The first layer to be separated includes a first insulating film and a light-emitting element that are provided in order from the first support side.

At least one of the first support and the second support transmits light emitted from the light-emitting element.

One embodiment of the present invention is a light-emitting device including a first support, a first layer to be separated overlapping with the first support, a bonding layer overlapping with the first layer to be separated, a second layer to be separated overlapping with the bonding layer, and a second support overlapping with the second layer to be separated.

The first support has isotropy. The first layer to be separated includes a first insulating film and a light-emitting element that are provided in order from the first support side.

The second layer to be separated includes a second insulating film. At least one of the first support and the second support transmits light emitted from the light-emitting element.

One embodiment of the present invention is the aforementioned light-emitting device in which the second support contains a material having isotropy.

One embodiment of the present invention is the aforementioned light-emitting device in which an adhesive layer is provided between the second layer to be separated and the second support, and the second support contains a material having anisotropy.

One embodiment of the present invention is the aforementioned light-emitting device in which the first layer to be separated includes a terminal portion electrically connected to the light-emitting element, and the second support includes an opening overlapping with the terminal portion.

The aforementioned light-emitting device of one embodiment of the present invention has a structure in which the first insulating film and the light-emitting element are positioned between the first support and the second support. Thus, the insulating film and the light-emitting element can be protected by the first support and the second support. As a result, a novel light-emitting device that is highly convenient or reliable can be provided.

One embodiment of the present invention is a method for manufacturing a light-emitting device including the following four steps.

In a first step, a process member is prepared. The process member includes a first substrate, a first separation layer overlapping with the first substrate, a first layer to be separated overlapping with the first separation layer, a bonding layer overlapping with the first layer to be separated, and a second support overlapping with the bonding layer. Note that the first layer to be separated includes a first insulating film and a light-emitting element. The first insulating film is positioned closer to the first substrate than the light-emitting element is. A first separation trigger is formed in the vicinity of an area that overlaps with an end of the bonding layer in the process member by removing part of the first layer to be separated from the first substrate.

In a second step, a surface layer including the first substrate is removed from the process member at the first separation trigger, whereby a first remaining portion is obtained.

In a third step, a material having fluidity is applied on the first layer to be separated.

In a fourth step, the material is cured to form a first support.

One embodiment of the present invention is a method for manufacturing a light-emitting device including the following eight steps.

In a first step, a process member is prepared. The process member includes a first substrate, a first separation layer overlapping with the first substrate, the first layer to be separated overlapping with the first separation layer, a bonding layer overlapping with the first layer to be separated, a second layer to be separated overlapping with the bonding layer, a second separation layer overlapping with the second layer to be separated, and a second substrate overlapping with the second separation layer. Note that the first layer to be separated includes a first insulating film and a light-emitting element. The first insulating film is positioned closer to the first substrate than the light-emitting element is. The second layer to be separated includes a second insulating film. A first separation trigger is formed in the vicinity of an area that overlaps with an end of the bonding layer in the process member by removing part of the first layer to be separated from the first substrate.

In a second step, a surface layer including the first substrate is removed from the process member at the first separation trigger, whereby a first remaining portion is obtained.

In a third step, a material having fluidity is applied on the first layer to be separated.

In a fourth step, the material is cured to form a first support, whereby a stack body is obtained.

In a fifth step, a second separation trigger is formed by removing part of the second layer to be separated from the second substrate.

In a sixth step, a surface layer including the second substrate is removed from the stack body at the second separation trigger, whereby a second remaining portion is obtained.

In a seventh step, a material having fluidity is applied on the second layer to be separated.

In an eighth step, the material is cured to form a second support.

One embodiment of the present invention is a method for manufacturing a light-emitting device including the following steps instead of the above seventh and eighth steps.

In the seventh step, the second support is attached to the second layer to be separated with an adhesive layer.

In the eighth step, the adhesive layer is cured.

The aforementioned method for manufacturing a light-emitting device of one embodiment of the present invention includes the step of forming the first support overlapping with the first layer to be separated with use of the material having fluidity. This results in a reduction in the pressure that is applied to the first layer to be separated when the first support is formed. It is thus possible to provide a method for manufacturing a novel light-emitting device that is highly convenient or reliable.

One embodiment of the present invention is a module including the aforementioned light-emitting device and an FPC or a touch sensor.

One embodiment of the present invention is an electronic device including the aforementioned light-emitting device or the aforementioned module, and a microphone, an antenna, a battery, an operation switch, or a housing.

In this specification, a layer between a pair of electrodes of an electroluminescent element is referred to as an EL layer. An organic electroluminescent element also includes a light-emitting layer containing a light-emitting organic compound. Hence, a light-emitting layer between a pair of electrodes is one mode of the EL layer.

In this specification, an image display device or a light source (including a lighting device) is included in the category of the light-emitting device.

In addition, the light-emitting device includes the following in its category: a module to which a connector such as a flexible printed circuit (FPC) or a tape carrier package (TCP) is attached; a module having a TCP provided with a printed wiring board at the end thereof; and a substrate over which an integrated circuit (IC) is mounted by a chip on glass (COG) method and a light-emitting element is formed.

Furthermore, in this specification, one of a first electrode and a second electrode of a transistor refers to a source electrode and the other refers to a drain electrode.

According to one embodiment of the present invention, a novel light-emitting device that is highly convenient or reliable can be provided. According to another embodiment of the present invention, a method for manufacturing a novel light-emitting device that is highly convenient or reliable can be provided. According to another embodiment of the present invention, a novel light-emitting device, a method for manufacturing a novel light-emitting device, a novel display device, or a novel device can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIGS. 1A, 1B1, 1B2, 1B3, and 1C illustrate structures of a light-emitting device of an embodiment;

FIGS. 2A1, 2A2, 2B1, 2B2, 2C, 2D1, 2D2, 2E1, and 2E2 illustrate a method for manufacturing a light-emitting device of an embodiment;

FIGS. 3A1, 3A2, 3B1, 3B2, 3C, 3D1, 3D2, 3E1; and 3E2 illustrate a method for manufacturing a light-emitting device of an embodiment;

FIGS. 4A, 4B, 4C1, 4C2, 4D1, and 4D2 illustrate a method for manufacturing a light-emitting device of an embodiment;

FIGS. 5A1, 5A2, 5B1, and 5B2 illustrate a method for manufacturing a light-emitting device of an embodiment;

FIGS. 9A1, 9A2, 9A3, 9B1, 9B2, 9C1, and 9C2 illustrate structures of data processing devices each using the light-emitting device of an embodiment;

FIG. 10A is a schematic view illustrating a structure of a display device of an example, and FIGS. 10B1, 10B2, 10C1, 10C2, and 10C3 are photographs of a fabricated display device;

DETAILED DESCRIPTION OF THE INVENTION

Figure 6A:
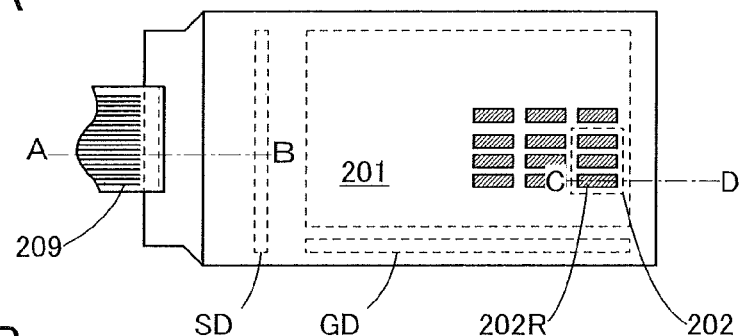
FIGS. 6A to 6D illustrate a structure of a display device of an embodiment.

A light-emitting device of one embodiment of the present invention includes a first insulating film and a light-emitting element which are positioned between a first support and a second support each having isotropy.

Hence, the insulating film and the light-emitting element can be protected by the first support and the second support, which allows a novel light-emitting device that is highly convenient or reliable to be provided. A method for manufacturing a novel light-emitting device that is highly convenient or reliable can also be provided. Furthermore, a novel light-emitting device, a method for manufacturing a novel light-emitting device, or a novel device can be provided.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, structures of light-emitting devices of one embodiment of the present invention will be described with reference to FIGS. 1A, 1B1, 1B2, 1B3, and 1C, which illustrate structures of light-emitting devices 200A to 200C of one embodiment of the present invention.

FIG. 1A is a top view of the light-emitting devices 200A to 200C of one embodiment of the present invention. FIG. 1B1 is a cross-sectional view of the light-emitting device 200A along line X1-X2 in FIG. 1A.

Structure Example of Light-Emitting Device: 1

The light-emitting device 200A shown in this embodiment includes, in order, a first support 41, a first layer to be separated 13 that overlaps with the first support 41, a bonding layer 30 that overlaps with the first layer to be separated 13, and a second support 42 that overlaps with the bonding layer 30 (see FIG. 1B1).

The first support 41 has certain isotropy.

The first layer to be separated 13 includes a first insulating film and a light-emitting element that are stacked in order from the first support 41 side.

At least one of the first support 41 and the second support 42 transmits light emitted from the light-emitting element.

The light-emitting device 200A shown in this embodiment includes the first insulating film and the light-emitting element which are positioned between the first support 41 and the second support 42. Hence, the insulating film and the light-emitting element can be protected by the first support 41 and the second support 42, which allows a novel light-emitting device that is highly convenient or reliable to be provided.

The second support 42 contains a material having certain isotropy.

The first layer to be separated 13 includes a terminal 219 electrically connected to the light-emitting element.

The second support 42 includes an opening overlapping with the terminal 219.

Individual components of the light-emitting device 200A will be described blow. Note that these components cannot be clearly distinguished and one component also serves as another component or includes part of another component in some cases.

Structure of One Embodiment of the Present Invention

The light-emitting device 200A includes the first support 41, the first layer to be separated 13, the bonding layer 30, or the second support 42.

First Support 41

The first support 41 is, for example, in contact with the first layer to be separated 13.

At least one of the first support 41 and the second support 42 transmits light emitted from the light-emitting element.

The first support 41 has certain isotropy. For example, the first support 41 contains a material having optical isotropy, mechanical isotropy, or the like. Specifically used is a material showing birefringence, e.g., anisotropy of the refractive index in mutually orthogonal directions in the same plane as the first support 41 is less than $2 \times 10^{-4}$, preferably $8 \times 10^{-5}$ or less, further preferably $5 \times 10^{-5}$ or less, and still further preferably $3 \times 10^{-5}$ or less. A material having optical isotropy hardly affects the optical properties of an optical film. For example, the properties of a polarization film is unlikely to be affected. Specifically, the properties of a circular polarization plate is unlikely to be affected. The isotropy of elastic modulus, the isotropy of breaking strength, or the like can be referred to as mechanical isotropy.

For example, a material having fluidity is applied on the first layer to be separated 13 and cured to form a solid film, and the obtained film can be used as the first support 41.

For example, a material having flexibility can be used for the first support 41.

For example, an organic material such as a resin or plastic can be used for the first support 41.

Specifically, polyester, polyolefin, polyamide, polyimide, polycarbonate, an epoxy resin, an acrylic resin, or the like can be used for the first support 41.

For example, a composite material in which a fibrous or particulate inorganic material (specifically, metal, metal oxide, inorganic oxide, glass, or the like) is dispersed can be used for the first support 41.

Specifically, a two-component epoxy resin can be applied so as to have a thickness of 50 μm after curing. For example, TB2001 or TB2022 manufactured by Three Bond Co., Ltd. can be used.

First Layer to be Separated 13

The first layer to be separated 13 includes an insulating film and a light-emitting element.

In the first layer to be separated 13, the insulating film is positioned closer to the first support 41 than the light-emitting element is.

In addition, the first layer to be separated 13 includes the terminal 219 electrically connected to the light-emitting element.

Insulating Film

The insulating film in the first layer to be separated 13 has a single-layer structure or a stacked structure of plural layers.

A layer containing an inorganic material, a layer containing an organic material, or a layer containing an inorganic material and an organic material can be used as the insulating film in the first layer to be separated 13.

For example, an inorganic material such as an inorganic oxide film, an inorganic nitride film, or an inorganic oxynitride film can be used for the insulating film in the first layer to be separated 13.

Specifically, a film containing silicon oxide, silicon nitride, silicon oxynitride, alumina, or the like can be used.

An example of a film that can be used as the insulating film is a film capable of preventing impurities affecting the light-emitting element from being diffused into the light-emitting element.

Specifically, a layered film in which a 600-nm-thick silicon oxynitride film and a 200-nm-thick silicon nitride film are stacked in order from the first support 41 side can be used as the insulating film. Note that a silicon oxynitride film contains more oxygen than nitrogen, and a silicon nitride oxide film contains more nitrogen than oxygen.

Specifically, a layered film in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film are stacked in order from the first support 41 side can be used as the insulating film.

Light-Emitting Element

The light-emitting element in the first layer to be separated 13 emits light to at least one of the first support 41 and the second support 42.

For example, an organic electroluminescent element can be used as the light-emitting element in the first layer to be separated 13.

Bonding Layer 30

With the bonding layer 30, the first layer to be separated 13 is attached to the second support 42.

An inorganic material, an organic material, a composite material of an inorganic material and an organic material, or the like can be used for the bonding layer 30.

For example, a glass layer with a melting point of 400° C. or lower, preferably 300° C. or lower can be used as the bonding layer 30. Alternatively, an adhesive or the like can be used for the bonding layer 30.

For example, an organic material such as a light curable adhesive, a reactive curable adhesive, a thermosetting adhesive, and/or an anaerobic adhesive can be used for the bonding layer 30.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used.

Second Support 42

The second support 42 is, for example, in contact with the bonding layer 30.

The second support 42 includes an opening overlapping with the terminal 219.

For example, a material similar to that for the first support 41 can be used for the second support 42.

For example, a material having fluidity is applied on the second layer to be separated 23 and cured to form a solid film, and the obtained film can be used as the second support 42. Furthermore, an opening can be formed by removing part of the second support 42.

Structure Example of Light-Emitting Device: 2

Another structure of the light-emitting device of one embodiment of the present invention will be described with reference to FIGS. 1A, 1B1, 1B2, 1B3, and 1C.

FIG. 1A is a top view of the light-emitting devices 200A to 200C of one embodiment of the present invention. FIG. 1B2 is a cross-sectional view of the light-emitting device 200B along line X1-X2 in FIG. 1A.

Note that the light-emitting device 200B is different from the light-emitting device 200A, which is described with reference to FIG. 1B1, in including a second layer to be separated 23. Different structures are described in detail below, and the above description is referred to for other similar structures.

The light-emitting device 200B shown in this embodiment includes, in order, the first support 41, the first layer to be separated 13 that overlaps with the first support 41, the bonding layer 30 that overlaps with the first layer to be separated 13, the second layer to be separated 23 that overlaps with the bonding layer 30, and the second support 42 that overlaps with the second layer to be separated 23 (see FIG. 1B2).

The first support 41 has certain isotropy.

The first layer to be separated 13 includes the first insulating film and the light-emitting element that are stacked in order from the first support 41 side.

The second layer to be separated 23 includes a second insulating film.

At least one of the first support 41 and the second support 42 transmits light emitted from the light-emitting element.

The second support 42 contains a material having certain isotropy.

The first layer to be separated 13 includes the terminal 219 electrically connected to the light-emitting element.

The second support 42 includes an opening overlapping with the terminal 219.

Structure of One Embodiment of the Present Invention

The light-emitting device 200B includes the first support 41, the first layer to be separated 13, the bonding layer 30, the second layer to be separated 23, or the second support 42.

Second Layer to be Separated 23

The second layer to be separated 23 includes the second insulating film. The light-emitting element in the first layer to be separated 13 is positioned between the first insulating film in the first layer to be separated 13 and the second insulating film in the second layer to be separated 23. This prevents diffusion of impurities into the light emitting element.

For example, a material similar to that for the insulating film in the first layer to be separated 13 can be used for the insulating film in the second layer to be separated 23.

In addition, the second layer to be separated 23 can include a variety of functional layers.

Examples of the functional layer include a color filter provided with a coloring layer that transmits light of a certain color. Alternatively, a touch sensor, which detects the approach or touch of an object such as a finger, can be used as the functional layer.

Second Support 42

The second support 42 is, for example, in contact with the second layer to be separated 23.

The second support 42 includes an opening overlapping with the terminal 219.

For example, a material similar to that for the first support 41 can be used for the second support 42.

Structure Example of Light-Emitting Device: 3

Another structure of the light-emitting device of one embodiment of the present invention will be described with reference to FIGS. 1A, 1B1, 1B2, 1B3, and 1C.

FIG. 1A is a top view of the light-emitting devices 200A to 200C of one embodiment of the present invention. FIGS. 1B3 and 1C are cross-sectional views of the light-emitting device 200C along line X1-X2 in FIG. 1A.

Note that the light-emitting device 200C is different from the light-emitting device 200B, which is described with reference to FIG. 1B2, in that an adhesive layer 32 is provided between the second layer to be separated 23 and the second support 42 and the second support 42 has certain anisotropy. Different structures are described in detail below, and the above description is referred to for other similar structures.

The light-emitting device 200C shown in this embodiment includes the adhesive layer 32 between the second layer to be separated 23 and the second support 42 (see FIG. 1B3 or FIG. 1C).

The second support 42 contains a material having certain anisotropy.

The first layer to be separated 13 includes an insulating film 210a and a light-emitting element 250 that are provided in order from the first support 41 side. In addition, the first layer to be separated 13 includes the terminal 219 and a wiring 211 (see FIG. 1C).

Note that the wiring 211 is electrically connected to the light-emitting element 250 and the terminal 219. Power is supplied to the terminal 219 and the power is supplied to the light-emitting element 250 through the wiring 211.

Structure of One Embodiment of the Present Invention

The light-emitting device 200C includes the first support 41, the first layer to be separated 13, the bonding layer 30, the second layer to be separated 23, the adhesive layer 32, or the second support 42 (see FIG. 1B3).

Adhesive Layer 32

The adhesive layer 32 has a function of attaching the second support 42 to the second layer to be separated 23.

An organic material, an inorganic material, or a composite material of an organic material and an inorganic material can be used for the adhesive layer 32.

For example, an organic material such as a light curable adhesive, a reactive curable adhesive, a thermosetting adhesive, and/or an anaerobic adhesive can be used for the adhesive layer 32.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used.

Second Support 42

The second support 42 contains a material having certain anisotropy. For example, the second support 42 contains a material having optical anisotropy. Specifically used is a material whose anisotropy of the refractive index in mutually orthogonal directions in the same plane as the second support 42 is $2\times10^{-4}$ or more, preferably $4\times10^{-4}$ or more.

For example, a film that is shaped by a stretching method can be used as the second support 42. A uniaxial stretching method, a sequential biaxial stretching method, or the like enable a material to be shaped into a film having optical anisotropy.

Specifically, a film containing polyester, polyolefin, polyamide, polyimide, polycarbonate, an epoxy resin, an acrylic resin, or the like that is shaped by a stretching method can be used as the second support 42. The film shaped by a stretching method, which is hardly stretched, can protect the light-emitting element from internally or externally applied stress.

First Layer to be Separated 13

The first layer to be separated 13 includes the insulating film 210a, the wiring 211, an insulating film 221, a partition wall 228, or the light-emitting element 250 (see FIG. 1C).

Insulating Film 210a

The insulating film 210a has a single-layer structure or a stacked structure of plural layers.

A layer containing an inorganic material, a layer containing an organic material, or a layer containing an inorganic material and an organic material can be used as the insulating film 210a in the first layer to be separated 13.

For example, an inorganic material such as an inorganic oxide film, an inorganic nitride film, or an inorganic oxynitride film can be used for the insulating film 210a in the first layer to be separated 13.

Specifically, a film containing silicon oxide, silicon nitride, silicon oxynitride, alumina, or the like can be used.

An example of a film that can be used as the insulating film 210a is a film capable of preventing impurities affecting the light-emitting element from being diffused into the light-emitting element.

Specifically, a layered film in which a 600-nm-thick silicon oxynitride film and a 200-nm-thick silicon nitride film are stacked in order from the first support 41 side can be used as the insulating film 210a. Note that a silicon oxynitride film contains more oxygen than nitrogen, and a silicon nitride oxide film contains more nitrogen than oxygen.

Specifically, a layered film in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film are stacked in order from the first support 41 side can be used as the insulating film 210a.

Terminal 219 and Wiring 211

The terminal 219 or the wiring 211 includes a conductive film.

A material having conductivity is used for the terminal 219, the wiring 211, or the like.

For example, an inorganic conductive material, an organic conductive material, a metal material, or a conductive ceramic material can be used for the wiring.

Specifically, a metal element selected from aluminum, gold, platinum, silver, chromium, tantalum, titanium, molybdenum, tungsten, nickel, iron, cobalt, palladium, and manganese; an alloy including any of the above-described metal elements; an alloy including any of the above-described metal elements in combination; or the like can be used for the wiring or the like.

Alternatively, a conductive oxide such as indium oxide, indium tin oxide, indium zinc oxide, zinc oxide, or zinc oxide to which gallium is added can be used.

Alternatively, graphene or graphite can be used. A film containing graphene can be formed, for example, by reducing a film containing graphene oxide. Examples of a reducing method include a method with application of heat and a method using a reducing agent.

Alternatively, a conductive high molecule can be used.

Insulating Film 221 and Partition Wall 228

The insulating film 221 and the partition wall 228 have insulating properties.

For example, an acrylic resin, polyimide, polyester, or the like can be used for the insulating film 221 or the partition wall 228.

Light-Emitting Element 250

The light-emitting element 250 has a function of emitting light to the first support 41 or the second support 42.

For example, an organic electroluminescent element can be used as the light-emitting element 250.

The light-emitting element 250 includes a bottom electrode 251, a top electrode 252 overlapping with the bottom electrode 251, and a layer 253 containing a light-emitting organic compound, which is positioned between the bottom electrode 251 and the top electrode 252.

At least one of the bottom electrode 251 and the top electrode 252 has light-transmitting properties so as to transmit light emitted from the layer 253 containing a light-emitting organic compound.

The bottom electrode 251 overlaps with an opening in the partition wall 228. Furthermore, the bottom electrode 251 overlaps with the insulating film 221.

Note that this embodiment can be combined with any of the other embodiments in this specification as appropriate.

Embodiment 2

In this embodiment, a method for manufacturing the light-emitting device of one embodiment of the present invention will be described with reference to FIGS. 2A1, 2A2, 2B1, 2B2, 2C, 2D1, 2D2, 2E1, and 2E2.

FIGS. 2A1, 2A2, 2B1, 2B2, 2C, 2D1, 2D2, 2E1, and 2E2 are schematic views illustrating a method for manufacturing the light-emitting device 200A of one embodiment of the present invention. FIGS. 2A2, 2B2, 2D2, and 2E2, which are on the right side of the drawings, are top views illustrating the method for manufacturing the light-emitting device 200A of one embodiment of the present invention. FIGS. 2A1, 2B1, 2C, 2D1, and 2E1, which are on the left side of the drawings, are cross-sectional views illustrating the method for manufacturing the light-emitting device 200A along section lines of the corresponding top views.

Example of Manufacturing Method of Light-Emitting Device

The method for manufacturing the light-emitting device shown in this embodiment includes the following four steps.

First Step

In the first step, a process member 80 is prepared. The process member 80 includes a first substrate 11, a first separation layer 12 overlapping with the first substrate 11, the first layer to be separated 13 overlapping with the first separation layer 12, the bonding layer 30 overlapping with the first layer to be separated 13, and the second support 42 overlapping with the bonding layer 30 (see FIGS. 2A1 and 2A2).

Note that the first layer to be separated 13 includes a first insulating film and a light-emitting element that are provided in order from the first substrate 11 side. A variety of structures that can be used for the process member 80 will be described in Embodiment 4.

First separation triggers 13s are formed in the vicinity of an area that overlaps with an end of the bonding layer 30 in the process member 80 by removing part of the first layer to be separated 13 from the first substrate 11 (see FIGS. 2B1 and 2B2).

For example, part of the first layer to be separated 13 can be removed from the first substrate 11 by inserting a sharp tip into the first layer to be separated 13 from the first substrate 11 side, or by a method using a laser or the like (e.g., a laser ablation method). Thus, the first separation triggers 13s can be formed.

Second Step

In the second step, a surface layer 80b including the first substrate 11 is removed from the process member 80 at the first separation triggers 13s, whereby a first remaining portion 80a is obtained (see FIG. 2C).

Note that the separation may be performed while the vicinity of the interface between the first separation layer 12 and the first layer to be separated 13 is irradiated with ions to remove static electricity. Specifically, the ions may be generated by an ionizer.

Furthermore, when the first layer to be separated 13 is separated from the first separation layer 12, a liquid may be injected into the interface between the first separation layer 12 and the first layer to be separated 13. Alternatively, a liquid may be ejected and sprayed by a nozzle 99. For example, as the liquid to be injected or sprayed, water, a polar solvent, or the like can be used.

By injecting the liquid, an influence of static electricity and the like generated with the separation can be reduced. Alternatively, the separation may be performed while a liquid that dissolves the separation layer is injected.

In particular, in the case where a film containing tungsten oxide is used as the first separation layer 12, the first layer to be separated 13 is preferably separated while a liquid containing water is injected or sprayed because a stress applied to the first layer to be separated 13 due to the separation can be reduced.

Third Step

In the third step, a material having fluidity is applied on the first layer to be separated 13 (see FIGS. 2D1 and 2D2).

Fourth Step

In the fourth step, the material having fluidity is cured to form the first support 41 (see FIGS. 2D1 and 2D2).

Fifth Step

In the fifth step, an opening is formed in the second support 42 (see FIGS. 2E1 and 2E2).

The method for manufacturing the light-emitting device 200A described in this embodiment includes the step of forming the first support 41 overlapping with the first layer to be separated 13 with use of the material having fluidity. This results in a reduction in the pressure that is applied to the first layer to be separated 13 when the first support 41 is formed. It is thus possible to provide a method for manufacturing a novel light-emitting device that is highly convenient or reliable.

Note that in some cases, a foreign substance generated in the manufacturing process of the light-emitting device 200A is attached onto the first layer to be separated 13. When a pressure is applied in such a state to the first layer to be separated 13 so that the first support 41 is formed on the first layer to be separated 13, the foreign substance might be pushed into the first layer to be separated 13. As a result, the insulating film or the light-emitting element in the first layer to be separated 13 is damaged in some cases.

In contrast, when the material having fluidity is used for forming the first support 41, the pressure high enough to push the foreign substance does not need to be applied in the fabrication of the light-emitting device 200A. This increases the yield of the light-emitting device 200A.

In particular, even when the first layer to be separated 13 includes an organic electroluminescent element or an insulating film with a thickness of 2 µm or less, preferably 1.2 µm or less, and further preferably 0.9 µm or less, the yield of the light-emitting device 200A can be increased.

Note that this embodiment can be combined with any of the other embodiments in this specification as appropriate.

Embodiment 3

In this embodiment, a method for manufacturing the light-emitting device of one embodiment of the present invention will be described with reference to FIGS. 3A1, 3A2, 3B1, 3B2, 3C, 3D1, 3D2, 3E1, and 3E2, FIGS. 4A, 4B, 4C1, 4C2, 4D1, and 4D2, and FIGS. 5A1, 5A2, 5B1, and 5B2.

FIGS. 3A1, 3A2, 3B1, 3B2, 3C, 3D1, 3D2, 3E1, and 3E2, and FIGS. 4A, 4B, 4C1, 4C2, 4D1, and 4D2 are schematic views illustrating a method for manufacturing the light-emitting device 200B of one embodiment of the present invention.

FIGS. 3A2, 3B2, 3D2, and 3E2, which are on the right side of the drawings, are top views illustrating the method for manufacturing the light-emitting device 200B of one embodiment of the present invention. FIGS. 3A1, 3B1, 3C, 3D1, and 3E1, which are on the left side of the drawings, are cross-sectional views illustrating the method for manufacturing the light-emitting device 200B along section lines of the corresponding top views.

FIGS. 4C2 and 4D2, which are on the right side of the drawings, are top views illustrating the method for manufacturing the light-emitting device 200B of one embodiment of the present invention. FIGS. 4A, 4B, 4C1, and 4D1, which are on the left side of the drawings, are cross-sectional views illustrating the method for manufacturing the light-emitting device 200B along section lines of the corresponding top views.

FIGS. 5A1, 5A2, 5B1, and 5B2 illustrate a method for manufacturing the light-emitting device 200C of one embodiment of the present invention.

Example of Manufacturing Method of Light-Emitting Device: 1

The method for manufacturing the light-emitting device shown in this embodiment includes the following eight steps.

First Step

In the first step, a process member 90 is prepared. The process member 90 includes the first substrate 11, the first separation layer 12 overlapping with the first substrate 11, the first layer to be separated 13 overlapping with the first separation layer 12, the bonding layer 30 overlapping with the first layer to be separated 13, the second layer to be separated 23 overlapping with the bonding layer 30, a second separation layer 22 overlapping with the second layer to be separated 23, and a second substrate 21 overlapping with the second separation layer 22 (see FIGS. 3A1 and 3A2).

Note that the first layer to be separated 13 includes a first insulating film and a light-emitting element that are provided in order from the first substrate 11 side. A variety of structures that can be used for the process member 90 will be described in Embodiment 4.

The second layer to be separated 23 includes a second insulating film.

The first separation triggers 13s are formed in the vicinity of an area that overlaps with an end of the bonding layer 30 in the process member 90 by removing part of the first layer to be separated 13 from the first substrate 11 (see FIGS. 3B1 and 3B2).

For example, part of the first layer to be separated 13 can be removed from the first substrate 11 by inserting a sharp tip into the first layer to be separated 13 from the first substrate 11 side, or by a method using a laser or the like (e.g., a laser ablation method). Thus, the first separation triggers 13s can be formed.

Second Step

In the second step, a surface layer 90b including the first substrate 11 is removed from the process member 90 at the first separation triggers 13s, whereby a first remaining portion 90a is obtained (see FIG. 3C).

Note that the separation may be performed while the vicinity of the interface between the first separation layer 12 and the first layer to be separated 13 is irradiated with ions to remove static electricity.

Furthermore, when the first layer to be separated 13 is separated from the first separation layer 12, a liquid may be injected into the interface between the first separation layer 12 and the first layer to be separated 13. Alternatively, a liquid may be ejected and sprayed by the nozzle 99. For example, as the liquid to be injected or sprayed, water, a polar solvent, or the like can be used.

Third Step

In the third step, a material having fluidity is applied on the first layer to be separated 13 (see FIGS. 3D1 and 3D2).

Fourth Step

In the fourth step, the material having fluidity is cured so that the first support 41 overlapping with the first layer to be separated 13 is formed in the first remaining portion 90a; thus, a stack body 91 is obtained (see FIGS. 3D1 and 3D2).

Fifth Step

In the fifth step, second separation triggers 91s are formed by removing part of the second layer to be separated 23 from the second substrate 21 (see FIGS. 3E1 and 3E2).

For example, with use of a cutter, the stack body 91 is cut in from the first support 41 side so as to remain partly, whereby part of the second layer to be separated 23 can be removed from the second substrate 21. Thus, the second separation triggers 91s can be formed. Note that a knife or other tools having a sharp tip can be used as the cutter.

Sixth Step

In the sixth step, a surface layer 91b including the second substrate 21 is removed from the stack body 91 at the second separation triggers 91s, whereby a second remaining portion 91a is obtained (see FIGS. 4A and 4B).

Note that the separation may be performed while the vicinity of the interface between the second separation layer 22 and the second layer to be separated 23 is irradiated with ions to remove static electricity.

Furthermore, when the second layer to be separated 23 is separated from the second separation layer 22, a liquid may be injected into the interface between the second separation layer 22 and the second layer to be separated 23. Alternatively, a liquid may be ejected and sprayed by the nozzle 99. For example, as the liquid to be injected or sprayed, water, a polar solvent, or the like can be used.

Seventh Step

In the seventh step, a material having fluidity is applied on the second layer to be separated 23 (see FIGS. 4C1 and 4C2).

Eighth Step

In the eighth step, the material having fluidity is cured to form the second support 42 (see FIGS. 4C1 and 4C2).

Ninth Step

In the ninth step, an opening is formed in the second support 42 (see FIGS. 4D1 and 4D2).

The method for manufacturing the light-emitting device 200B described in this embodiment includes the step of forming the first support 41 overlapping with the first layer to be separated 13 with use of the material having fluidity, and the step of forming the second support 42 overlapping with the second layer to be separated 23 with use of the material having fluidity. This results in a reduction in the pressure that is applied to the first layer to be separated 13 when the first support 41 is formed, and a reduction in the pressure that is applied to the second layer to be separated 23 when the second support 42 is formed. It is thus possible to provide a method for manufacturing a novel light-emitting device that is highly convenient or reliable.

Note that in some cases, a foreign substance generated in the manufacturing process of the light-emitting device 200B is attached onto the first layer to be separated 13 or the second layer to be separated 23. When a pressure is applied in such a state so that the first support 41 is formed on the first layer to be separated 13 or the second support 42 is formed on the second layer to be separated 23, the foreign substance might be pushed into the first layer to be separated 13 or the second layer to be separated 23. As a result, the insulating film or the light-emitting element in the first layer to be separated 13 or the insulating film in the second layer to be separated 23 is damaged in some cases.

In contrast, when the material having fluidity is used for forming the first support 41 or the second support 42, the pressure high enough to push the foreign substance does not need to be applied in the fabrication of the light-emitting device 200B. This increases the yield of the light-emitting device 200B.

If the first layer to be separated 13 or the second layer to be separated 23 is damaged by the foreign substance or the like pushed therein, when the surface layer 91b including the second substrate 21 is removed from the stack body 91 in the sixth step, the stack body 91 is sometimes broken from the damaged portion without any intention.

In particular, even when the first layer to be separated 13 includes an organic electroluminescent element or an insulating film with a thickness of 2 μm or less, preferably 1.2 μm or less, and further preferably 0.9 μm or less, the yield of the light-emitting device 200B can be increased.

Example of Manufacturing Method of Light-Emitting Device: 2

Another example of the method for manufacturing the light-emitting device of one embodiment of the present invention will be described with reference to FIGS. 3A1, 3A2, 3B1, 3B2, 3C, 3D1, 3D2, 3E1, and 3E2, FIGS. 4A, 4B, 4C1, 4C2, 4D1, and 4D2, and FIGS. 5A1, 5A2, 5B1, and 5B2.

FIGS. 5A1, 5A2, 5B1, and 5B2 are diagrams replacing part of FIGS. 4A, 4B, 4C1, 4C2, 4D1, and 4D2 so as to illustrate a method for manufacturing the light-emitting device 200C.

Specifically, FIG. 5A1 or 5A2 replaces FIG. 4C1 or 4C2 so as to illustrate the manufacturing method of the light-emitting device 200C, and FIG. 5B1 or 5B2 replaces FIG. 4D1 or 4D2 so as to illustrate the manufacturing method of the light-emitting device 200C.

Note that the manufacturing method of the light-emitting device 200C is different from that of the light-emitting device 200B, which is described with reference to FIGS. 3A1, 3A2, 3B1, 3B2, 3C, 3D1, 3D2, 3E1, and 3E2, and FIGS. 4A, 4B, 4C1, 4C2, 4D1, and 4D2, in the seventh step of attaching the second support 42 to the second remaining portion 91a with the adhesive layer 32 and the eighth step of curing the adhesive layer 32. Different steps are described in detail below, and the above description is referred to for other similar steps.

Seventh Step

In the seventh step, the second support 42 is attached to the second layer to be separated 23 with the adhesive layer 32 (see FIGS. 5A1 and 5A2).

Eighth Step

In the eighth step, the adhesive layer 32 is cured.

Ninth Step

In the ninth step, an opening is formed in the second support 42 (see FIGS. 5B1 and 5B2).

The method for manufacturing the light-emitting device 200C described in this embodiment includes the step of forming the first support 41 overlapping with the first layer to be separated 13 with use of the material having fluidity. This results in a reduction in the pressure that is applied to the first layer to be separated 13 when the first support 41 is formed. It is thus possible to provide a method for manufacturing a novel light-emitting device that is highly convenient or reliable.

Note that in some cases, a foreign substance generated in the manufacturing process of the light-emitting device 200C is attached onto the first layer to be separated 13. When a pressure is applied in such a state to the first layer to be separated 13 so that the first support 41 is formed on the first layer to be separated 13, the foreign substance might be pushed into the first layer to be separated 13. As a result, the insulating film or the light-emitting element in the first layer to be separated 13 or the insulating film in the second layer to be separated 23 is damaged in some cases.

In contrast, when the material having fluidity is used for forming the first support 41, the pressure high enough to push the foreign substance does not need to be applied in the fabrication of the light-emitting device 200C. This increases the yield of the light-emitting device 200C.

If the first layer to be separated 13 or the second layer to be separated 23 is damaged by the foreign substance or the like pushed therein, when the surface layer 91b including the second substrate 21 is removed from the stack body 91 in the sixth step, the stack body 91 is sometimes broken from the damaged portion without any intention.

In particular, even when the first layer to be separated 13 includes an organic electroluminescent element or an insulating film with a thickness of 2 µm or less, preferably 1.2 µm or less, and further preferably 0.9 µm or less, the yield of the light-emitting device 200C can be increased.

Note that this embodiment can be combined with any of the other embodiments in this specification as appropriate.

Embodiment 4

In this embodiment, structures of process members that can be processed into the light-emitting device of one embodiment of the present invention will be described with reference to FIGS. 2A1, 2A2, 2B1, 2B2, 2C, 2D1, 2D2, 2E1, and 2E2 or FIGS. 3A1, 3A2, 3B1, 3B2, 3C, 3D1, 3D2, 3E1, and 3E2.

FIGS. 2A1 and 2A2 or FIGS. 3A1 and 3A2 are schematic views illustrating structures of the process members that can be processed into the light-emitting device of one embodiment of the present invention.

FIG. 2A1 is a cross-sectional view illustrating a structure of the process member 80 that can be processed into the light-emitting device 200A, and FIG. 2A2 is the corresponding top view.

FIG. 3A1 is a cross-sectional view illustrating a structure of the process member 90 that can be processed into the light-emitting device 200B or 200C, and FIG. 3A2 is the corresponding top view.

Structure Example of Process Member: 1

The process member 80 includes the first substrate 11, the first separation layer 12 on the first substrate 11, the first layer to be separated 13 whose one surface is in contact with the first separation layer 12, the bonding layer 30 whose one surface is in contact with the other surface of the first layer to be separated 13, and the second support 42 which is in contact with the other surface of the bonding layer 30 (see FIGS. 2A1 and 2A2).

Note that the first separation triggers 13s may be provided in the vicinity of an area that overlaps with an end of the bonding layer 30 (see FIGS. 2B1 and 2B2).

First Substrate

There is no particular limitation on the first substrate 11 as long as the first substrate 11 has heat resistance high enough to withstand a manufacturing process and a thickness and a size which can be used in a manufacturing apparatus.

For the first substrate 11, an organic material, an inorganic material, a composite material of an organic material and an inorganic material, or the like can be used. For example, an inorganic material such as glass, ceramic, or metal can be used for the first substrate 11.

Specifically, non-alkali glass, soda-lime glass, potash glass, crystal glass, or the like can be used for the first substrate 11. Specifically, an inorganic oxide film, an inorganic nitride film, an inorganic oxynitride film, or the like can be used for the first substrate 11. For example, silicon oxide, silicon nitride, silicon oxynitride, or an alumina film can be used for the first substrate 11. Alternatively, SUS, aluminum, or the like can be used for the first substrate 11.

For example, an organic material such as a resin, a resin film, or plastic can be used for the first substrate 11. Specifically, a resin film or a resin plate of polyester, polyolefin, polyamide, polyimide, polycarbonate, an acrylic resin, or the like can be used for the first substrate 11.

For example, a composite material such as a resin film to which a metal plate, a thin glass plate, or a film of an inorganic material is attached can be used for the first substrate 11. For example, a composite material formed by dispersing a fibrous or particulate metal, glass, an inorganic material, or the like into a resin film can be used for the first substrate 11. For example, a composite material formed by dispersing a fibrous or particulate resin, an organic material, or the like into an inorganic material can be used for the first substrate 11.

For the first substrate 11, a single-layer material or a stacked-layer material in which a plurality of layers are stacked can be used. For example, a stacked-layer material in which a base, an insulating film that prevents diffusion of impurities contained in the base, and the like are stacked can be used for the first substrate 11. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the first substrate 11. Alternatively, a stacked-layer material in which a resin and a film that prevents diffusion of impurities contained in the resin, such as a silicon oxide film, a silicon nitride film, and a silicon oxynitride film are stacked can be used for the first substrate 11.

First Separation Layer

The first separation layer 12 is provided between the first substrate 11 and the first layer to be separated 13. In the vicinity of the first separation layer 12, a boundary where the first layer to be separated 13 can be separated from the first substrate 11 is formed. There is no particular limitation on the first separation layer 12 as long as it has heat resistance high enough to withstand the manufacturing process of the first layer to be separated 13 formed thereon.

For the first separation layer 12, for example, an inorganic material or an organic resin can be used.

Specifically, an inorganic material such as a metal containing an element selected from tungsten, molybdenum, titanium, tantalum, niobium, nickel, cobalt, zirconium, zinc, ruthenium, rhodium, palladium, osmium, iridium, and silicon, an alloy containing the element, or a compound containing the element can be used for the first separation layer 12.

Specifically, an organic material such as polyimide, polyester, polyolefin, polyamide, polycarbonate, or an acrylic resin can be used for the first separation layer 12.

For example, a single-layer material or a stacked-layer material in which a plurality of layers are stacked can be used for the first separation layer 12. Specifically, a material in which a layer containing tungsten and a layer containing an oxide of tungsten are stacked can be used for the first separation layer 12.

The layer containing an oxide of tungsten can be formed by stacking another layer on a layer containing tungsten. Specifically, the layer containing an oxide of tungsten may be formed by stacking silicon oxide, silicon oxynitride, or the like on a layer containing tungsten. The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

Specifically, a layer containing polyimide can be used as the first separation layer 12. The layer containing polyimide has heat resistance high enough to withstand various manufacturing steps required to form the first layer to be separated 13. For example, the layer containing polyamide has heat resistance of 200° C. or higher, preferably 250° C. or higher, further preferably 300° C. or higher, and still further preferably 350° C. or higher. By heating a film containing a monomer formed on the first substrate 11, a film containing polyimide obtained by condensation of the monomer can be used.

First Layer to be Separated

The first layer to be separated 13 can be separated from the first substrate 11 and includes a functional layer.

The boundary that separates the first layer to be separated 13 from the first substrate 11 may be formed between the first layer to be separated 13 and the first separation layer 12 or may be formed between the first separation layer 12 and the first substrate 11. In the case where the boundary is formed between the first layer to be separated 13 and the first separation layer 12, the first separation layer 12 is not included in the light-emitting device, and in the case where the boundary is formed between the first separation layer 12 and the first substrate 11, the first separation layer 12 is included in the light-emitting device.

For example, an inorganic material, an organic material, a single-layer material, or a stacked-layer material can be used for the first layer to be separated 13.

Specifically, an inorganic oxide film, an inorganic nitride film, an inorganic oxynitride film, or the like can be used for the first layer to be separated 13. For example, silicon oxide, silicon nitride, silicon oxynitride, or an alumina film can be used for the first layer to be separated 13.

Alternatively, for example, a resin, a resin film, or plastic can be used for the first layer to be separated 13. Specifically, a polyamide film or the like can be used for the first layer to be separated 13.

For example, an insulating film capable of preventing diffusion of impurities affecting the functional layer can be used as the functional layer overlapping with the first separation layer 12 and between the first separation layer 12 and the functional layer.

Specifically, a 0.7-mm-thick glass plate is used as the first substrate 11, and a stacked-layer material in which a 200-nm-thick silicon oxynitride film and a 30-nm-thick tungsten film are stacked in order from the first substrate 11 side can be used for the first separation layer 12.

A film including a stacked-layer material in which a 600-nm-thick silicon oxynitride film and a 200-nm-thick silicon nitride film are stacked in order from the first separation layer 12 side can be used as the first layer to be separated 13. Note that a silicon oxynitride film contains more oxygen than nitrogen, and a silicon nitride oxide film contains more nitrogen than oxygen.

Alternatively, a layered film in which a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film are stacked in order from the first separation layer 12 side can be used as the first layer to be separated 13.

Alternatively, as the first layer to be separated 13, a polyimide film, a layer containing silicon oxide, silicon nitride, or the like, and the functional layer may be stacked in order from the first separation layer 12 side.

Functional Layer

The functional layer is included in the first layer to be separated 13. For example, a functional circuit, a functional element, an optical element, a functional film, or a layer including a plurality of elements selected from these can be used as the functional layer. Specifically, a display element that can be used for a light-emitting element or a display device, a pixel circuit for driving the display element, a driver circuit for driving the pixel circuit, a color filter, a touch sensor, a moisture-proof film, and the like, and a layer including two or more selected from these can be given.

Bonding Layer

There is no particular limitation on the bonding layer 30 as long as the first layer to be separated 13 can be attached to the second support 42 with the bonding layer 30.

For the bonding layer 30, an inorganic material, an organic resin, or the like can be used.

Specifically, a glass layer with a melting point of 400° C. or lower, preferably 300° C. or lower, an adhesive, or the like can be used.

For example, a light curable adhesive, a reactive curable adhesive, a thermosetting adhesive, and/or an anaerobic adhesive can be used for the bonding layer 30.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used.

Second Support

There is no particular limitation on the second support 42 as long as the second support 42 has heat resistance high enough to withstand a manufacturing process and a thickness and a size which can be used in a manufacturing apparatus.

For example, the second support 42 can be formed using a material similar to that of the first substrate 11 or a material similar to that of the first support 41 described in Embodiment 1, which is obtained by curing a material having fluidity to form a solid film.

Separation Trigger

In the process member 80, the first separation triggers 13s may be provided in the vicinity of an area that overlaps with an end of the bonding layer 30 (see FIGS. 2B1 and 2B2).

The first separation triggers 13s are formed by removing part of the first layer to be separated 13 from the first substrate 11.

Part of the first layer to be separated 13 can be removed from the first separation layer 12 by inserting a sharp tip into the first layer to be separated 13 from the first substrate 11 side, or by a method using a laser or the like (e.g., a laser ablation method). Thus, the first separation triggers 13s can be formed.

Structure Example of Process Member: 2

A structure of the process member 90 that can be processed into the light-emitting device 200B or 200C of one embodiment of the present invention will be described with reference to FIGS. 3A1 and 3A2.

The process member 90 is different from the process member 80 in that the other surface of the bonding layer 30 is in contact with one surface of the second layer to be separated 23 instead of the second support 42. Different structures are described in detail below, and the above description is referred to for other similar structures.

Specifically, the process member 90 includes the first substrate 11 on which the first separation layer 12 and the first layer to be separated 13 whose one surface is in contact with the first separation layer 12 are formed, the second substrate 21 on which the second separation layer 22 and the second layer to be separated 23 whose other surface is in contact with the second separation layer 22 are formed, and the bonding layer 30 whose one surface is in contact with the other surface of the first layer to be separated 13 and whose other surface is in contact with the one surface of the second layer to be separated 23.

Second Substrate

The second substrate 21 can have the same structure as the first substrate 11.

Second Separation Layer

The second separation layer 22 can have the same structure as the first separation layer 12.

Second Layer to be Separated

The second layer to be separated 23 can have the same structure as the first layer to be separated 13.

Specifically, a structure may be employed in which the first layer to be separated 13 includes a functional circuit and the second layer to be separated 23 includes a functional layer that prevents diffusion of impurities into the functional circuit.

Specifically, a structure may be employed in which the first layer to be separated 13 includes a, light-emitting element that emits light to the second layer to be separated 23, a pixel circuit for driving the light-emitting element, and a driver circuit for driving the pixel circuit, and the second layer to be separated 23 includes a color filter that transmits part of light emitted from the light-emitting element and a moisture-proof film that prevents diffusion of impurities into the light-emitting element. In addition, the second layer to be separated 23 may include a touch sensor.

Note that the processed member with such a structure can be used for a stack body that can be used as a flexible display device or a touch panel.

Note that this embodiment can be combined with any of the other embodiments in this specification as appropriate.

Embodiment 5

In this embodiment, structures of display devices of one embodiment of the present invention will be described with reference to FIGS. 6A to 6D and FIGS. 7A to 7D.

Figure 6B:
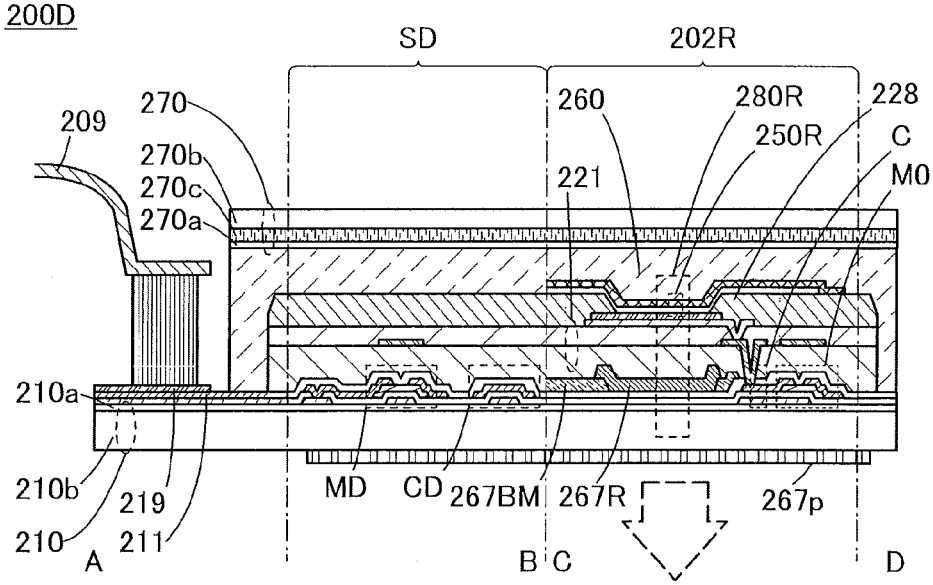

FIGS. 6A to 6D illustrate a structure of a display device of one embodiment of the present invention. FIG. 6A is a top view illustrating a method for manufacturing a display device 200D of one embodiment of the present invention. FIG. 6B is a cross-sectional view of the display device 200D along lines A-B and C-D in FIG. 6A.

Structure Example of Display Device: 1

The display device 200D described in this embodiment includes a base 210, a base 270 overlapping with the base 210, a bonding layer 260 between the base 210 and the base 270, a pixel 202, a driver circuit GD for supplying a control signal to the pixel 202, a driver circuit SD for supplying a display signal to the pixel 202, and a region 201 provided with the pixel 202 (see FIGS. 6A and 6B).

The base 210 includes an insulating film 210a and a first support 210b having flexibility.

The base 270 includes an insulating film 270a, a flexible base 270b, and a resin layer 270c with which the insulating film 270a is attached to the flexible base 270b.

With the bonding layer 260, the base 210 is attached to the base 270.

The pixel 202 includes a sub-pixel 202R and the like, and is supplied with a display signal (see FIG. 6A). Note that the pixel 202 includes the sub-pixel 202R for displaying red, a sub-pixel for displaying green, and a sub-pixel for displaying blue.

The sub-pixel 202R includes a circuit including a driving transistor M0, a capacitor C, and a display module 280R provided with a display element (see FIG. 6B).

The display module 280R includes a light-emitting element 250R and a coloring layer 267R overlapping with the light-emitting element 250R on a light-emitting side. Note that the light-emitting element 250R is one embodiment of the display element.

The light-emitting element 250R includes a lower electrode, an upper electrode, and a layer containing a light-emitting organic compound.

The circuit includes the driving transistor M0 and is provided between the base 210 and the light-emitting element 250R. The insulating film 221 is provided between the circuit and the light-emitting element 250R.

A second electrode of the driving transistor M0 is electrically connected to the lower electrode of the light-emitting element 250R through an opening provided in the insulating film 221.

A first electrode of the capacitor C is electrically connected to a gate of the driving transistor M0. A second electrode of the capacitor C is electrically connected to the second electrode of the driving transistor M0.

The driver circuit SD includes a transistor MD and a capacitor CD.

The wiring 211 is electrically connected to the terminal 219. The terminal 219 is electrically connected to a flexible printed board 209.

Note that a light-blocking layer 267BM is provided so as to surround the coloring layer 267R.

In addition, the partition wall 228 is formed so as to cover an end portion of the lower electrode of the light-emitting element 250R.

A functional film 267p may be provided in a position overlapping with the region 201 (see FIG. 6B).

Accordingly, the display device 200D can display data on the side where the base 210 is provided.

Entire Structure

The display device 200D includes the base 210, the base 270, the bonding layer 260, the pixel 202, the driver circuit GD, the driver circuit SD, or the region 201.

Base 210

The base 210 includes the insulating film 210a and the first support 210b.

A film capable of preventing diffusion of impurities can be used as the insulating film 210a. For example, a material that includes one or more films selected from a silicon oxide film, a silicon nitride film, a silicon oxynitride film, and the like can be used for the insulating film 210a.

A material having certain isotropy can be used for the first support 210b. For example, a material having optical isotropy can be used for the first support 210b. For example, a liquid resin is applied and cured to form a solid film, and the obtained film can be used as the first support 210b.

Specifically, polyester, polyolefin, polyamide, polyimide, polycarbonate, an epoxy resin, an acrylic resin, or the like can be used for the first support 210b.

Base 270

There is no particular limitation on the base 270 as long as the base 270 has heat resistance high enough to withstand a manufacturing process and a thickness and a size which can be used in a manufacturing apparatus.

For the base 270, an organic material, an inorganic material, a composite material of an organic material and an inorganic material, or the like can be used.

For example, an inorganic material such as glass, ceramic, or metal can be used for the base 270.

Specifically, non-alkali glass, soda-lime glass, potash glass, crystal glass, or the like can be used for the base 270.

Specifically, an inorganic oxide film, an inorganic nitride film, an inorganic oxynitride film, or the like can be used for the base 270. For example, silicon oxide, silicon nitride, silicon oxynitride, or an alumina film can be used for the base 270.

Specifically, SUS, aluminum, or the like can be used for the base 270.

For example, an organic material such as a resin, a resin film, or plastic can be used for the base 270.

Specifically, a resin film or a resin plate of polyester, polyolefin, polyamide, polyimide, polycarbonate, an acrylic resin, or the like can be used for the base 270.

For example, a composite material such as a resin film to which a metal plate, a thin glass plate, or a film of an inorganic material is attached can be used for the base 270.

For example, a composite material formed by dispersing a fibrous or particulate metal, glass, an inorganic material, or the like into a resin film can be used for the base 270.

For example, a composite material formed by dispersing a fibrous or particulate resin, an organic material, or the like into an inorganic material can be used for the base 270.

For the base 270, a single-layer material or a stacked-layer material in which a plurality of layers are stacked can be used. For example, a stacked-layer material in which a base, an insulating film that prevents diffusion of impurities contained in the base, and the like are stacked can be used for the base 270.

Specifically, a stacked-layer material in which glass and one or a plurality of films that prevent diffusion of impurities contained in the glass and that are selected from a silicon oxide film, a silicon nitride film, a silicon oxynitride film, and the like are stacked can be used for the base 270.

Alternatively, a stacked-layer material in which a resin and a film that prevents diffusion of impurities contained in the resin, such as a silicon oxide film, a silicon nitride film, and a silicon oxynitride film are stacked can be used for the base 270.

Specifically, a stack body including the flexible base 270b, the insulating film 270a that prevents diffusion of impurities into the light-emitting element 250R, and the resin layer 270c with which the insulating film 270a is attached to the flexible base 270b can be used.

Bonding Layer

There is no particular limitation on the bonding layer 260 as long as the bonding layer 260 attaches the base 210 and the base 270 to each other.

An inorganic material, an organic material, a composite material of an inorganic material and an organic material, or the like can be used for the bonding layer 260.

For example, a glass layer with a melting point of 400° C. or lower, preferably 300° C. or lower can be used as the bonding layer 260.

For example, an organic material such as a light curable adhesive, a reactive curable adhesive, a thermosetting adhesive, and/or an anaerobic adhesive can be used for the bonding layer 260.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used.

Pixel

A variety of transistors can be used as the driving transistor M0.

For example, a transistor in which a Group 14 element, a compound semiconductor, an oxide semiconductor, or the like is used for the semiconductor layer can be used. Specifically, a semiconductor containing silicon, a semiconductor containing gallium arsenide, an oxide semiconductor containing indium, or the like can be used for the semiconductor layer of the driving transistor M0.

For example, single crystal silicon, polysilicon, or amorphous silicon can be used for the semiconductor layer of the driving transistor M0.

For example, a bottom-gate transistor or a top-gate transistor can be used.

A variety of display elements can be used in the display module 280R. For example, an organic EL element which includes a lower electrode, an upper electrode, and a layer containing a light-emitting organic compound between the lower electrode and the upper electrode can be used as the display element.

Note that in the case where a light-emitting element is used as the display element, a light-emitting element combined with a microcavity structure can be used. For example, the microcavity structure may be formed using the lower electrode and the upper electrode of the light-emitting element so that light with a specific wavelength can be extracted from the light-emitting element efficiently.

Specifically, a reflective film which reflects visible light is used as one of the upper and lower electrodes, and a semi-transmissive and semi-reflective film which transmits part of visible light and reflects part of visible light is used as the other. The upper electrode is located with respect to the lower electrode so that light with a specific wavelength can be extracted efficiently.

For example, a layer which emits light including red, green, and blue light can be used as the layer containing a light-emitting organic compound. In addition, a layer which emits light including yellow light can also be used as the layer containing a light-emitting organic compound.

As the coloring layer 267R, a layer containing a material such as a pigment or a dye can be used. Accordingly, the display module 280R can emit light of a particular color.

For example, a microcavity for extracting red light efficiently and a coloring layer which transmits red light may be used in the display module 280R for displaying red, a microcavity for extracting green light efficiently and a coloring layer which transmits green light may be used in a display module for displaying green, or a microcavity for extracting blue light efficiently and a coloring layer which transmits blue light may be used in a display module for displaying blue light.

Furthermore, a microcavity for extracting yellow light efficiently and a coloring layer which transmits yellow light may be used in a display module.

Driver Circuit

A variety of transistors can be used as the transistor MD of the driver circuit SD. For example, the transistor MD can have the same structure as the driving transistor M0.

The capacitor CD can have the same structure as the capacitor C.

Region

The region 201 includes a plurality of pixels 202 arranged in a matrix. The region 201 can display the display data and can supply the sensing data associated with coordinates data of the pixels provided in the region 201. For example, the region 201 can sense the presence or absence of an object located close to the region 201 and can supply the result together with coordinates data.

Others

A conductive material can be used for the wiring 211 or the terminal 219.

For example, an inorganic conductive material, an organic conductive material, metal, or conductive ceramic can be used for the wiring.

Specifically, a metal element selected from aluminum, gold, platinum, silver, chromium, tantalum, titanium, molybdenum, tungsten, nickel, iron, cobalt, palladium, and manganese; an alloy including any of the above-described metal elements; an alloy including any of the above-described metal elements in combination; or the like can be used for the wiring or the like.

Alternatively, a conductive oxide such as indium oxide, indium tin oxide, indium zinc oxide, zinc oxide, or zinc oxide to which gallium is added can be used.

Alternatively, graphene or graphite can be used. A film containing graphene can be formed, for example, by reducing a film containing graphene oxide. Examples of a reducing method include a method with application of heat and a method using a reducing agent.

Alternatively, a conductive high molecule can be used.

For the light-blocking layer 267BM, a light-blocking material can be used. For example, a resin in which a pigment is dispersed, a resin containing a dye, or an inorganic film such as a black chromium film can be used for the light-blocking layer 267BM. For the light-blocking layer 267BM, carbon black, a metal oxide, a composite oxide containing a solid solution of a plurality of metal oxides, or the like can be used.

An insulating material can be used for the partition wall 228. For example, an inorganic material, an organic material, or a stacked-layer material of an inorganic material and an organic material can be used. Specifically, a film containing silicon oxide, silicon nitride, or the like, acrylic, polyimide, a photosensitive resin, or the like can be used.

The functional film 267p can be provided on the display surface side of the display device. For example, an inorganic material, an organic material, or a composite material of an inorganic material and an organic material can be used for the functional film 267p. Specifically, a ceramic coat layer containing alumina, silicon oxide, or the like, a hard coat layer containing a UV curable resin or the like, an anti-reflection film, a circularly polarizing plate, or the like can be used.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electric or magnetic effect may be included. Examples of a display device having an EL element include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, Electronic Liquid Powder (registered trademark), or an electrophoretic element, such as electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode. Graphene or graphite may be a multilayer film in which a plurality of layers are stacked. Such provision of graphene or graphite enables an n-type GaN semiconductor layer including crystals to be easily formed thereover. Note that an AlN layer may be provided between the n-type GaN semiconductor layer including crystals and graphene or graphite. The GaN semiconductor layer may be formed by MOCVD. Note that when the graphene is provided, the GaN semiconductor layer can also be formed by a sputtering method.

For example, in this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal) or a TFD (thin film diode) can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

Note that an example of the display device is shown here; however, one embodiment of the present invention is not limited thereto. For example, data is not necessarily displayed. As an example, the display device may be used as a lighting device. By using the device as a lighting device, it can be used as interior lighting having an attractive design. Alternatively, it can be used as lighting from which light radiates in various directions. Further alternatively, it may be used as a light source, for example, a backlight or a front light. In other words, it may be used as a lighting device for the display panel.

Modification Example of Display Portion: 1

A variety of transistors can be used in the display device 200D.

Figure 6C:
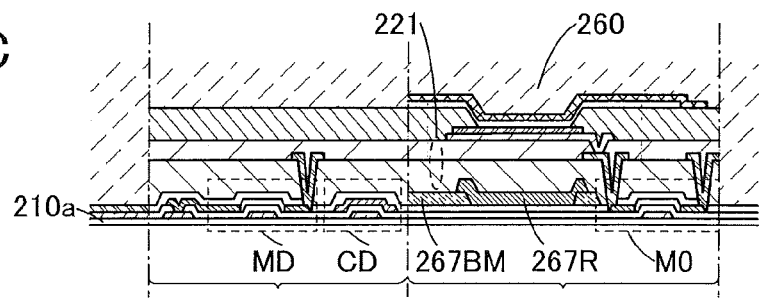

Structures in which bottom-gate transistors are used in the region 201 are illustrated in FIGS. 6B and 6C.

For example, a semiconductor layer containing an oxide semiconductor, amorphous silicon, or the like can be used in the driving transistor M0 and the transistor MD shown in FIG. 6B.

For example, a film represented by an In-M-Zn oxide that contains at least indium (In), zinc (Zn), and M (a metal such as Al, Ga, Ge, Y, Zr, Sn, La, Ce, or Hf) is preferably included. Alternatively, both In and Zn are preferably contained.

As a stabilizer, gallium (Ga), tin (Sn), hafnium (Hf), aluminum (Al), zirconium (Zr), or the like can be given. As another stabilizer, lanthanoid such as lanthanum (La), cerium (Ce), praseodymium (Pr), neodymium (Nd), samarium (Sin), europium (Eu), gadolinium (Gd), terbium (Tb), dysprosium (Dy), holmium (Ho), erbium (Er), thulium (Tm), ytterbium (Yb), or lutetium (Lu) can be given.

As an oxide semiconductor included in an oxide semiconductor film, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

For example, a semiconductor layer containing polycrystalline silicon that is obtained by crystallization process such as laser annealing can be used in the driving transistor M0 and the transistor MD shown in FIG. 6C.

Figure 6D:
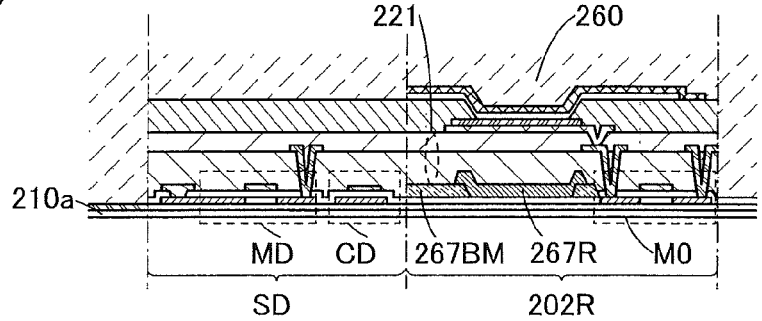

A structure in which top-gate transistors are used in the display device 200D is shown in FIG. 6D.

For example, a semiconductor layer containing polycrystalline silicon, a single crystal silicon film that is transferred from a single crystal silicon substrate, or the like can be used in the driving transistor M0 and the transistor MD shown in FIG. 6D.

Structure Example of Display Device: 2

Figure 7A:
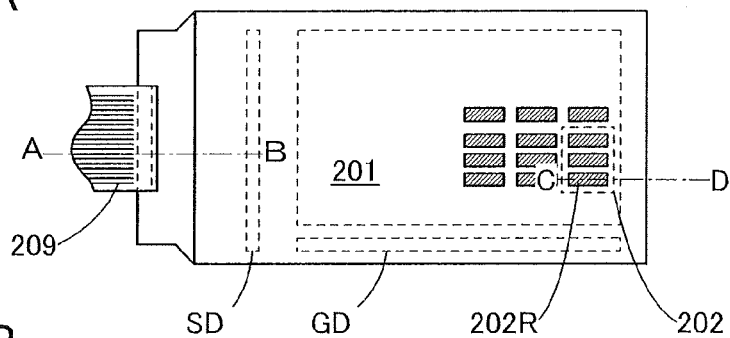
FIGS. 7A to 7D illustrate a structure of a display device of an embodiment.
Figure 7B:
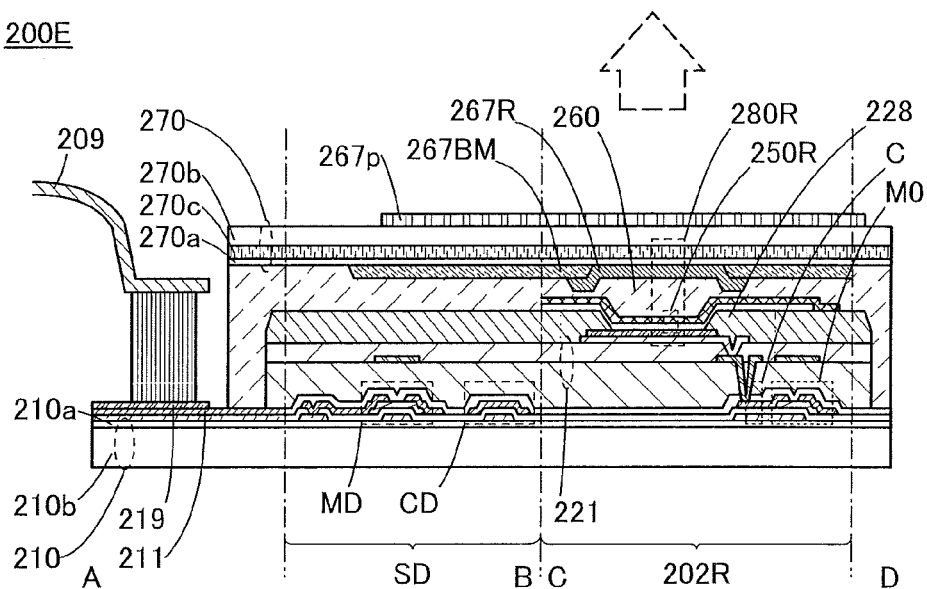
Figure 7C:
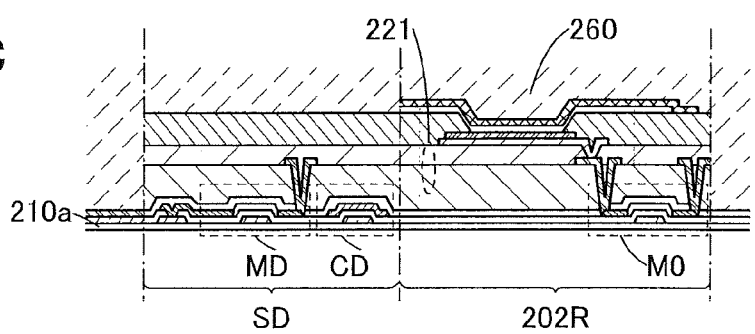
Figure 7D:
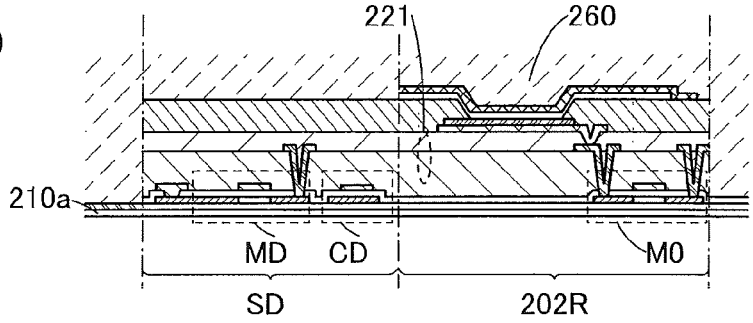

FIGS. 7A to 7D illustrate a structure of a display device of one embodiment of the present invention. FIG. 7A is a top view of a display device 200E in one embodiment of the present invention, and FIG. 7B is a cross-sectional view including cross sections taken along lines A-B and C-D in FIG. 7A.

The display device 200E described in this embodiment is different from the display device 200D described with reference to FIGS. 6A to 6D in that the coloring layer 267R and the light-blocking layer 267BM surrounding the coloring layer 267R are provided between the base 270 and the light-emitting element 250R, that the functional film 267p is provided on the base 270 side, and that the display module 280R emits light to the side where the base 270 is provided. As the other components, similar components can be used.

Accordingly, the display device 200E can display data on the side where the base 270 is provided. In addition, the display device 200E can supply sensing data by sensing an object that is located close to or in contact with the side where the base 270 is provided.

Note that this embodiment can be combined with any of the other embodiments in this specification as appropriate.

Embodiment 6

In this embodiment, a structure of a data processing device that can be formed using an input/output device using the display device of one embodiment of the present invention will be described with reference to FIGS. 8A to 8C.

Figure 8A:
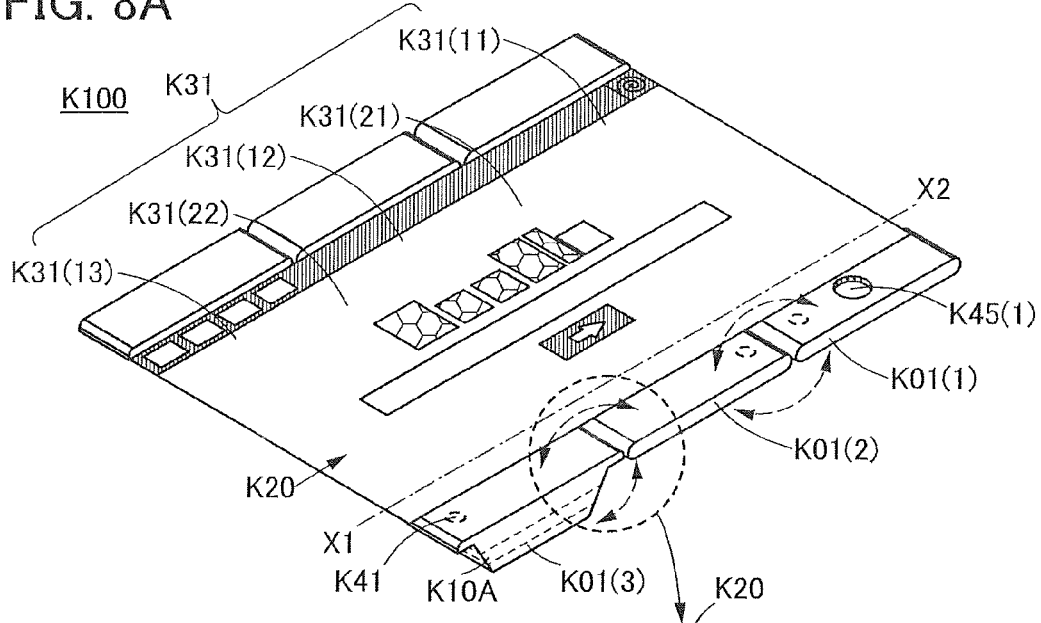
FIGS. 8A to 8C illustrate a structure of a data processing device using the light-emitting device of an embodiment.
Figure 8B:
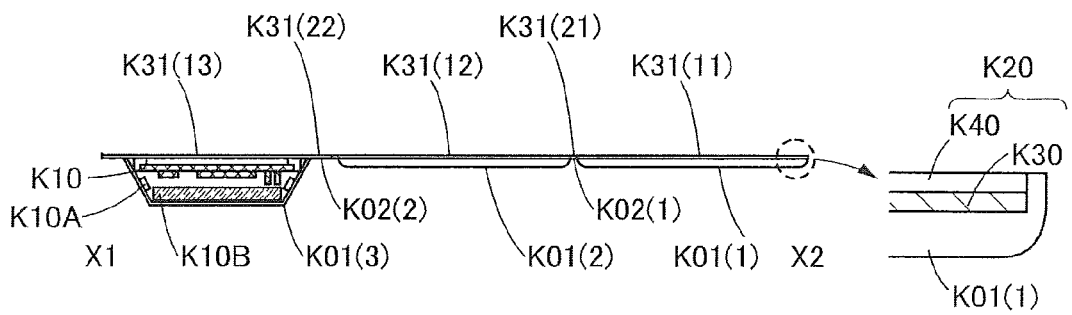
Figure 8C:
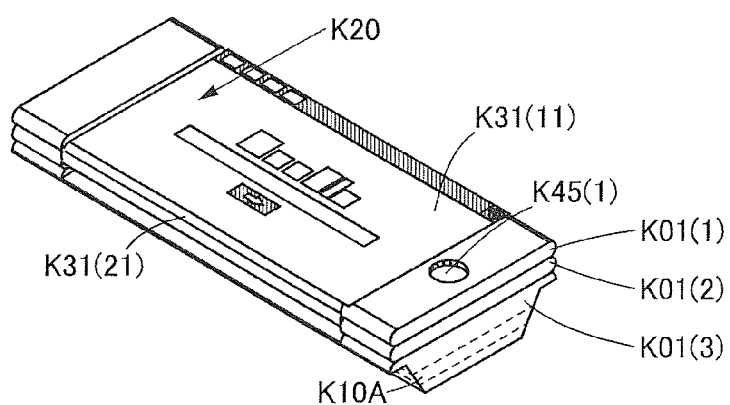

FIGS. 8A to 8C illustrate the data processing device of one embodiment of the present invention.

FIG. 8A is a projection view illustrating an input/output device K20 in a data processing device K100 of one embodiment of the present invention which is unfolded. FIG. 8B is a cross-sectional view of the data processing device K100 along line X1-X2 in FIG. 8A. FIG. 8C is a projection view illustrating the input/output device K20 which is folded.

Structure Example of Data Processing Device

The data processing device K100 described in this embodiment includes the input/output device K20, an arithmetic device K10, and housings K01(1) to K01(3) (see FIGS. 8A to 8C).

Input/Output Device

The input/output device K20 includes a display portion K30 and an input device K40. The input/output device K20 is supplied with image data V and supplies sensing data S (see FIG. 8B).

The display portion K30 is supplied with the image data V, and the input device K40 supplies the sensing data S.

The input/output device K20, in which the input device K40 and the display portion K30 integrally overlap with each other, serves not only as the display portion K30 but also as the input device K40.

The input/output device K20 using a touch sensor as the input device K40 and a display panel as the display portion K30 can be referred to as a touch panel.

Display Portion

The display portion K30 includes a region K31 where a first region K31(11), a first bendable region K31(21), a second region K31(12), a second bendable region K31(22), and a third region K31(13) are arranged in stripes in this order (see FIG. 8A).

The display portion K30 can be folded and unfolded along a first fold line formed in the first bendable region K31(21) and a second fold line formed in the second bendable region K31(22) (see FIGS. 8A and 8C).

Arithmetic Device

The arithmetic device K10 includes an arithmetic unit and a storage unit that stores a program to be executed by the arithmetic unit. The arithmetic device K10 supplies the image data V and is supplied with the sensing data S.

Housing

A housing includes the housing K01(1), a hinge K02(1), the housing K01(2), a hinge K02(2), and the housing K01(3) which are placed in this order.

In the housing K01(3), the arithmetic device K10 is stored. The housings K01(1) to K01(3) hold the input/output device K20, and enable the input/output device K20 to be folded and unfolded (see FIG. 8B).

In this embodiment, the data processing device including the three housings and the two hinges connecting the three housings is given as an example. The information processing device having such a structure can be folded while the input/output device K20 is bent at two positions.

Note that n (n is a natural number greater than or equal to 2) housings can be connected using (n−1) hinges. The information processing device having such a structure can be folded while the input/output device K20 is bent at (n−1) positions.

The housing K01(1) overlaps with the first region K31(11) and is provided with a button K45(1).

The housing K01(2) overlaps with the second region K31(12).

The housing K01(3) overlaps with the third region K31(13) and stores the arithmetic device K10, an antenna K10A, and a battery K10B.

The hinge K02(1) overlaps with the first bendable region K31(21) and connects the housing K01(1) rotatably to the housing K01(2).

The hinge K02(2) overlaps with the second bendable region K31(22) and connects the housing K01(2) rotatably to the housing K01(3).

The antenna K10A is electrically connected to the arithmetic device K10 and supplies a signal or is supplied with a signal.

In addition, the antenna K10A is wirelessly supplied with power from an external device and supplies power to the battery K10B.

The battery K10B is electrically connected to the arithmetic device K10 and supplies power or is supplied with power.

Folding Sensor

A folding sensor K41 determines whether the housing is folded or unfolded and supplies data showing the state of the housing.

The data showing the state of the housing is supplied to the arithmetic device K10.

In the case where the data showing the state of the housing K01 is data showing a folded state, the arithmetic device K10 supplies the image data V including a first image to the first region K31(11) (see FIG. 8C).

In the case where the data showing the state of the housing K01 is data showing an unfolded state, the arithmetic device K10 supplies the image data V to the region K31 of the display portion K30 (see FIG. 8A).

Note that this embodiment can be combined with any of the other embodiments in this specification as appropriate.

Embodiment 7

In this embodiment, a structure of a data processing device that can be formed using an input/output portion using the display device of one embodiment of the present invention will be described with reference to FIGS. 9A1, 9A2, 9A3, 9B1, 9B2, 9C1, and 9C2.

FIGS. 9A1, 9A2, 9A3, 9B1, 9B2, 9C1, and 9C2 illustrate the data processing devices of one embodiment of the present invention.

FIGS. 9A1 to 9A3 are projection views illustrating a data processing device of one embodiment of the present invention.

FIGS. 9B1 and 9B2 are projection views illustrating a data processing device of one embodiment of the present invention.

FIGS. 9C1 and 9C2 are a top view and a bottom view illustrating a data processing device of one embodiment of the present invention.

Data Processing Device A

A data processing device 3000A includes an input/output portion 3120 and a housing 3101 supporting the input/output portion 3120 (see FIGS. 9A1 to 9A3).

The data processing device 3000A further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The data processing device 3000A can display data on its side surface and/or top surface.

A user of the data processing device 3000A can supply operation instructions by using a finger in contact with the side surface and/or the top surface.

Data Processing Device B

A data processing device 3000B includes the input/output portion 3120 and an input/output portion 3120b (see FIGS. 9B1 and 9B2).

The data processing device 3000B further includes the housing 3101 and a belt-shaped flexible housing 3101b that support the input/output portion 3120.

The data processing device 3000B further includes the housing 3101 supporting the input/output portion 3120b.

The data processing device 3000B further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The data processing device 3000B can display data on the input/output portion 3120 supported by the belt-shaped flexible housing 3101b.

A user of the data processing device 3000B can supply operation instructions by using a finger in contact with the input/output portion 3120.

Data Processing Device C

A data processing device 3000C includes the input/output portion 3120 and the housings 3101 and 3101b supporting the input/output portion 3120 (see FIGS. 9C1 and 9C2).

The input/output portion 3120 and the housing 3101b have flexibility.

The data processing device 3000C further includes an arithmetic portion, a memory portion storing a program that is executed by the arithmetic portion, and a power source such as a battery supplying power for driving the arithmetic portion.

Note that the housing 3101 stores the arithmetic portion, the memory portion, the battery, and the like.

The data processing device 3000C can be folded in two at the housing 3101b.

Note that this embodiment can be combined with any of the other embodiments in this specification as appropriate.

Embodiment 8

In this embodiment, a manufacturing method of one embodiment of the present invention will be described with reference to FIGS. 11A and 11B, FIG. 12, and FIGS. 13A and 13B.

Example of Manufacturing Method: 1

Figure 11A:
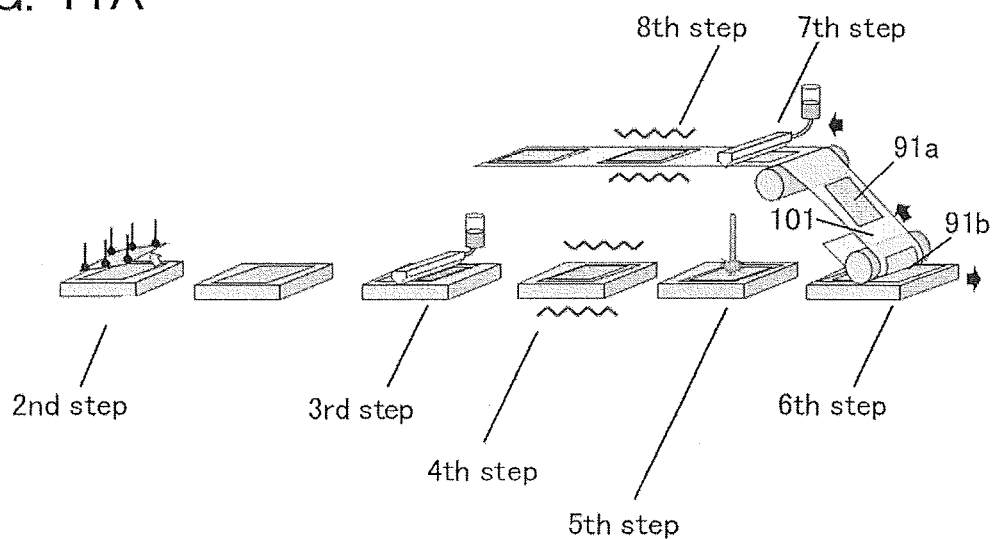
FIGS. 11A and 11B each illustrate a method for manufacturing a light-emitting device of an example.

In the manufacturing method shown in this embodiment, a first transfer belt 101 is used (see FIG. 11A).

In the sixth step described in Embodiment 3, the surface layer 91b including the second substrate 21 is removed from the stack body 91 at the second separation triggers 91s, whereby the second remaining portion 91a is obtained.

For example, with use of the first transfer belt 101 having an adhesive surface, the second remaining portion 91a is transferred onto the first transfer belt 101 (see FIG. 11A).

While the second remaining portion 91a is transferred with use of the first transfer belt 101, the seventh and eighth steps described in Embodiment 3 are carried out.

Example of Manufacturing Method: 2

Figure 11B:
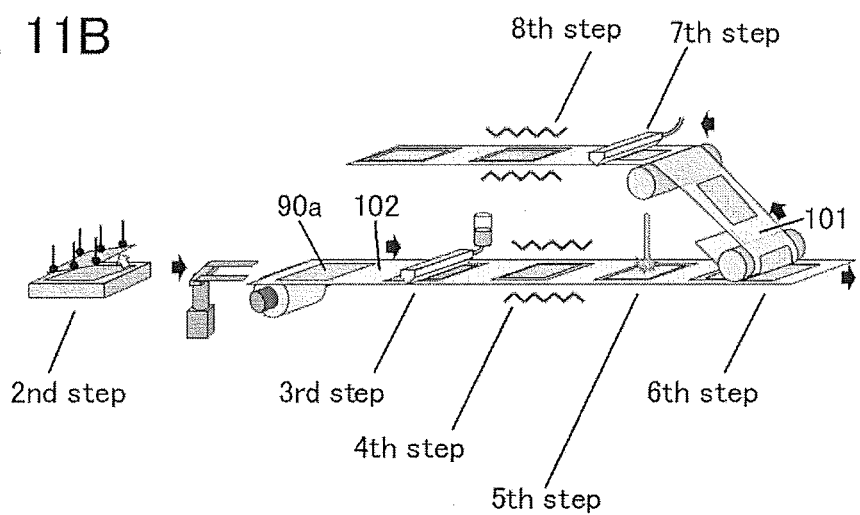

In the manufacturing method described with reference to FIG. 11B, the first transfer belt 101 and a second transfer belt 102 are used. Note that this manufacturing method is different from that shown in FIG. 11A in that the third to sixth steps are carried out while the first remaining portion 90a is transferred with use of the second transfer belt 102.

After the second step shown in Embodiment 3, the first remaining portion 90a is put on the second transfer belt 102.

While the first remaining portion 90a is transferred with use of the second transfer belt 102, the third to sixth steps described in Embodiment 3 are carried out.

Example of Manufacturing Method: 3

Figure 12:
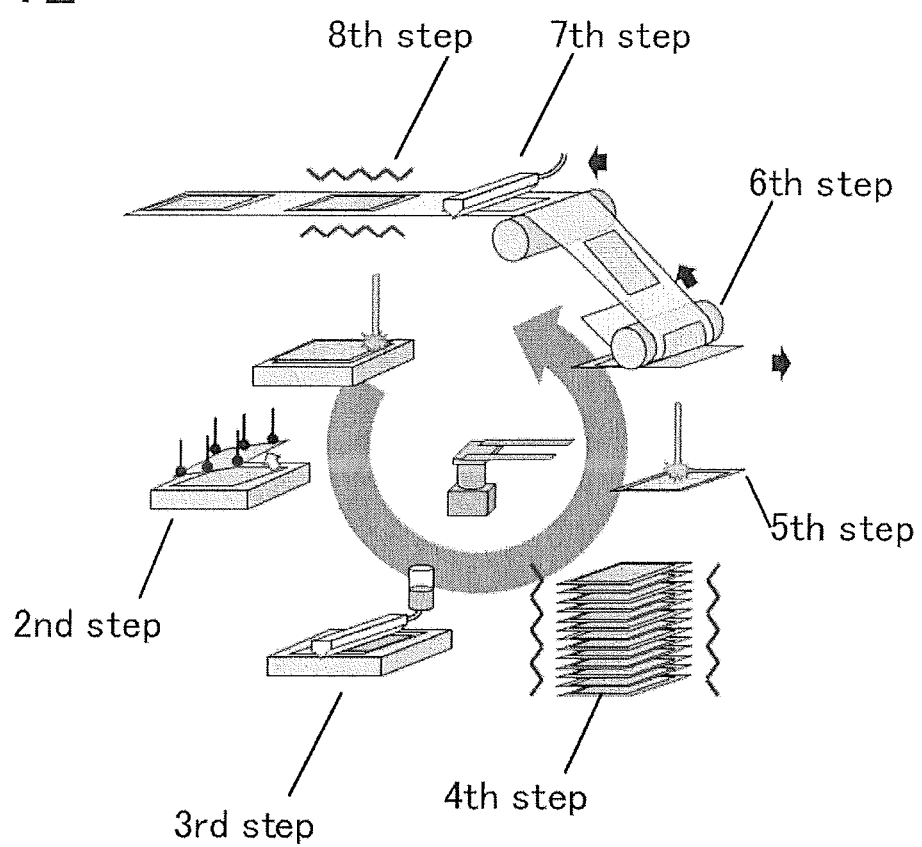
FIG. 12 illustrates a method for manufacturing a light-emitting device of an example.

In the manufacturing method described with reference to FIG. 12, the first transfer belt 101 is used. Note that in this manufacturing method, plural process members are processed by batch treatment in the fourth step, which is different from the sequential manufacturing method shown in FIG. 11A.

Example of Manufacturing Method: 4

Figure 13A:
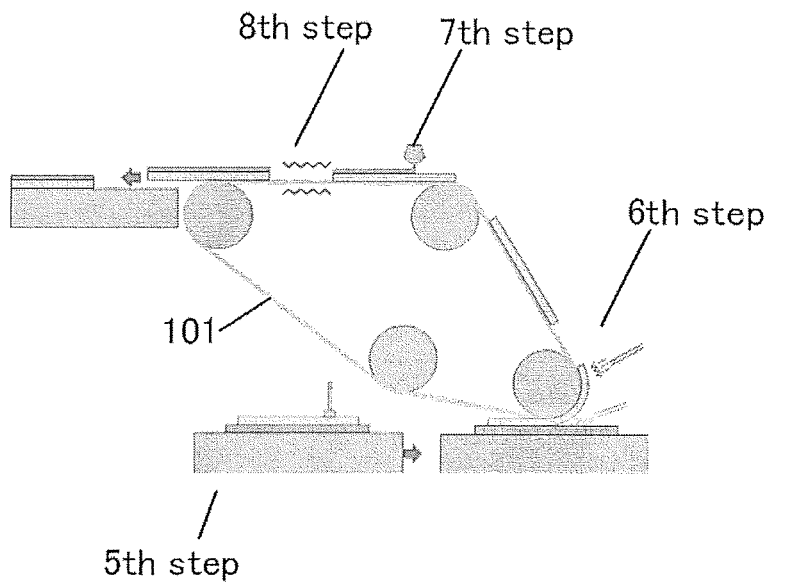
FIGS. 13A and 13B each illustrate a method for manufacturing a display device of an example.

In the manufacturing method described with reference to FIG. 13A, the ring-shaped first transfer belt 101 is used.

Figure 13B:
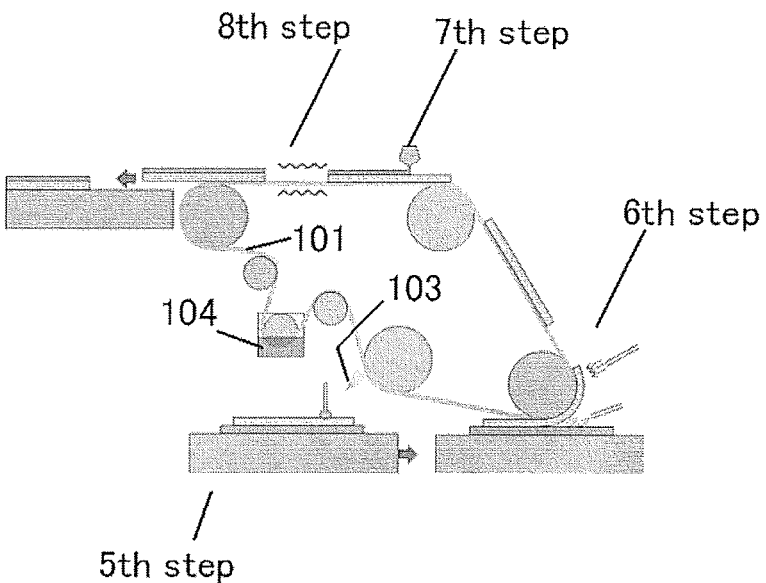

The manufacturing method shown in FIG. 13B includes the step of forming an adhesive surface on the ring-shaped first transfer belt 101 with use of a coating apparatus 103, and the step of removing the adhesive surface with use of a washing apparatus 104.

Example 1

In this example, the results of fabricating a display device using the light-emitting device of one embodiment of the present invention will be described with reference to FIGS. 10A, 10B1, 10B2, and 10C1 to 10C3.

FIGS. 10A, 10B1, 10B2, and 10C1 to 10C3 show a fabricated display device 1200: FIG. 10A is a cross-sectional view illustrating a structure of the display device 1200; FIG. 10B1, a photograph showing an appearance of the display device 1200; and FIG. 10B2, a photograph showing the display device 1200 that is bent.

FIGS. 10C1 to 10C3 are photographs of images displayed on the display device 1200.

The display device 1200 includes a first support 1041, a first layer to be separated 1013, a bonding layer 1030, a second layer to be separated 1023, an adhesive layer 1032, and a second support 1042 (see FIG. 10A).

First Support 1041

The first support 1041 has flexibility. A 50-μm-thick epoxy resin was used for the first support 1041.

The 50-μm-thick epoxy resin was formed in the following manner: a two-component epoxy resin (TB2022 manufactured by Three Bond Co., Ltd.) was applied on the first layer to be separated 1013 with a spin coater so as to have a thickness of 50 μm after curing, and then was cured.

Note that the 50-μm-thick epoxy resin used for the first support 1041 showed a birefringence of $6.0 \times 10^{-5}$ at wavelength of 550 nm. The sample used for the measurement was formed on a glass substrate with a spin coater. The birefringence was calculated from the retardation that was measured with a retardation inspection system (RETS-100 produced by Otsuka Electronics Co., Ltd). The measurement was performed at 23° C. by rotating analyzer.

First Layer to be Separated 1013

The first layer to be separated 1013 includes an insulating film 1013a and a display portion 1013b. Note that the insulating film 1013a is positioned closer to the first support 1041 than the display portion 1013b is.

A layered film of a silicon oxide film and a silicon oxynitride film was used as the insulating film 1013a.

The display portion 1013b includes a pixel area 1201 including a plurality of pixels, and a driver circuit for driving the pixels. The display portion 1013b also includes a wiring for supplying an image signal to the pixels, a wiring for supplying a power source potential to the pixels, and the like. The wirings are electrically connected to a terminal 1219.

Each of the pixels includes a sub-pixel for displaying red, a sub-pixel for displaying green, and a sub-pixel for displaying blue. Each sub-pixel includes a light-emitting element emitting light and a pixel circuit for driving the light-emitting element.

An organic EL element was used as the light-emitting element. A bottom electrode was a reflective electrode, an upper electrode was a semi-transmissive and semi-reflective electrode, and a layer containing a light-emitting organic compound was a layer stacked to emit white light. The light-emitting element has a structure in which light is emitted to the second support 1042 side through the upper electrode.

Note that the reflective electrode includes a metal film and a light-transmitting conductive film stacked over the metal film. The thickness of the light-transmitting conductive film was adjusted with a color displayed in the sub-pixel.

Bonding Layer 1030

With the bonding layer 1030, the first layer to be separated 1013 is attached to the second layer to be separated 1023. An epoxy resin (manufactured by ALTECO Co., Ltd.) with a thickness of approximately 5 μm was used for the bonding layer 1030.

Second Layer to be Separated 1023

The second layer to be separated 1023 includes an insulating film 1023a and a color filter 1023b. Note that the insulating film 1023a is positioned closer to the second support 1042 than the color filter 1023b is.

A layered film of a silicon oxide film and a silicon oxynitride film was used as the insulating film 1023a.

The color filter 1023b includes a region transmitting red light, a region transmitting green light, and a region transmitting blue light. The region transmitting red light, the region transmitting green light, and the region transmitting blue light were arranged so as to overlap with the sub-pixel for displaying red, the sub-pixel for displaying green, and the sub-pixel for displaying blue, respectively.

Note that a light-blocking film serving as a black matrix was provided between the regions of the color filter 1023b.

Adhesive Layer 1032

With the adhesive layer 1032, the second layer to be separated 1023 is attached to the second support 1042. An epoxy resin (manufactured by ALTECO INC.) with a thickness of approximately 5 μm was used for the adhesive layer 1032.

Second Support 1042

The second support 1042 has flexibility. An aramid film having light-transmitting properties was used as the second support 1042.

Evaluation Results

The fabricated display device 1200 has a thickness of approximately 100 μm (see FIG. 10B1). The display device 1200 has flexibility and was able to be repeatedly bent at a curvature radius of approximately 5 mm (see FIG. 10B2).

A flexible printed board FPC was electrically connected to the terminal 1219 and an image was displayed (see FIGS.

10C1 to 10C3). Specifically, a white image, a checked pattern, and color bars were able to be displayed.

The display device 1200 was able to be repeatedly bent while clear images were displayed thereon.

Example 2

A display device 1200B was fabricated. The display device 1200B has a structure similar to that in Example 1 except that a 27-μm-thick epoxy resin was used for the first support 1041.

The display device 1200B was repeatedly bent at a curvature radius of 5 mm 100,000 times, and then preserved in an environment with a temperature of 65° C. and a humidity of 95%.

Evaluation Results

After the preservation, clear images, specifically, a white image and a checked pattern, were able to be displayed.

Even when the display device 1200B was repeatedly bent, damage such as a crack was not generated in the first layer to be separated 1013 or the second layer to be separated 1023, and clear images were able to be displayed.

This application is based on Japanese Patent Application serial No. 2014-132741 filed with Japan Patent Office on Jun. 27, 2014, the entire contents of which are hereby incorporated by reference.

What is claimed is:

1. A method for manufacturing a light-emitting device, comprising:
    a step of preparing a process member, the process member comprising:
        a first substrate, a first separation layer, a first layer to be separated, a bonding layer, and a second support,
        wherein the first separation layer and the first substrate include a region where they overlap with each other,
        wherein the first layer to be separated and the first separation layer include a region where they overlap with each other,
        wherein the bonding layer and the first layer to be separated include a region where they overlap with each other,
        wherein the second support and the bonding layer include a region where they overlap with each other,
        wherein the first layer to be separated includes a first insulating film and a light-emitting element, and
        wherein the first insulating film is between the light-emitting element and the first substrate,
    a first step of forming a first separation trigger in a vicinity of an area that overlaps with an end of the bonding layer in the process member by removing part of the first layer to be separated from the first substrate;
    a second step of removing a surface layer including the first substrate from the process member at the first separation trigger, thereby obtaining a first remaining portion;
    a third step of applying a material having fluidity on the first layer to be separated; and
    a fourth step of curing the material to form a first support.

2. The method for manufacturing the light-emitting device according to claim 1, wherein the second support contains a material having isotropy.

3. The method for manufacturing the light-emitting device according to claim 1,
    wherein the first layer to be separated includes a terminal portion electrically connected to the light-emitting element, and
    wherein the second support includes an opening overlapping with the terminal portion.

4. The method for manufacturing the light-emitting device according to claim 1 further comprising forming a module including the light-emitting device according to claim 1 and an FPC or a touch sensor.

5. The method for manufacturing the light-emitting device according to claim 1 further comprising forming an electronic device including the light-emitting device according to claim 1 and a microphone, an antenna, a battery, an operation switch, or a housing.

6. A method for manufacturing a light-emitting device, comprising:
    a step of preparing a process member, the process member comprising:
        a first substrate, a first separation layer, a first layer to be separated, a bonding layer, a second layer to be separated, a second separation layer, and a second substrate,
        wherein the first separation layer and the first substrate include a region where they overlap with each other,
        wherein the first layer to be separated and the first separation layer include a region where they overlap with each other,
        wherein the bonding layer and the first layer to be separated include a region where they overlap with each other,
        wherein the second layer to be separated and the bonding layer include a region where they overlap with each other,
        wherein the second separation layer and the second layer to be separated include a region where they overlap with each other,
        wherein the second substrate and the second separation layer include a region where they overlap with each other,
        wherein the first layer to be separated includes a first insulating film and a light-emitting element,
        wherein the first insulating film is between the light-emitting element and the first substrate, and
        wherein the second layer to be separated includes a second insulating film,
    a first step of forming a first separation trigger in a vicinity of an area that overlaps with an end of the bonding layer in the process member by removing part of the first layer to be separated from the first substrate;
    a second step of removing a surface layer including the first substrate from the process member at the first separation trigger, thereby obtaining a first remaining portion;
    a third step of applying a material having fluidity on the first layer to be separated;
    a fourth step of curing the material to form a first support, thereby obtaining a stack body;
    a fifth step of forming a second separation trigger by removing part of the second layer to be separated from the second substrate;
    a sixth step of removing a surface layer including the second substrate from the stack body at the second separation trigger, thereby obtaining a second remaining portion;
    a seventh step of applying a material having fluidity on the second layer to be separated; and an eighth step of curing the material to form a second support.

7. The method for manufacturing the light-emitting device according to claim 6, wherein the second support contains a material having isotropy.

8. The method for manufacturing the light-emitting device according to claim 6,
wherein an adhesive layer is between the second layer to be separated and the second support, and
wherein the second support contains a material having anisotropy.

9. The method for manufacturing the light-emitting device according to claim 6,
wherein the first layer to be separated includes a terminal portion electrically connected to the light-emitting element, and
wherein the second support includes an opening overlapping with the terminal portion.

10. The method for manufacturing the light-emitting device according to claim 6 further comprising forming a module including the light-emitting device according to claim 6 and an FPC or a touch sensor.

11. The method for manufacturing the light-emitting device according to claim 6 further comprising forming an electronic device including the light-emitting device according to claim 6 and a microphone, an antenna, a battery, an operation switch, or a housing.

12. The method for manufacturing the light-emitting device according to claim 6,
wherein in the seventh step, the second support is attached to the second layer to be separated with an adhesive layer, and
wherein in the eighth step, the adhesive layer is cured.

* * * * *